US010103329B2

(12) United States Patent
Banno et al.

(10) Patent No.: US 10,103,329 B2
(45) Date of Patent: Oct. 16, 2018

(54) SWITCHING ELEMENT AND METHOD FOR MANUFACTURING SWITCHING ELEMENT

(71) Applicant: NEC Corporation, Tokyo (JP)

(72) Inventors: Naoki Banno, Tokyo (JP); Munehiro Tada, Tokyo (JP); Toshitsugu Sakamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/410,282

(22) PCT Filed: Jun. 3, 2013

(86) PCT No.: PCT/JP2013/065376
§ 371 (c)(1),
(2) Date: Dec. 22, 2014

(87) PCT Pub. No.: WO2013/190988
PCT Pub. Date: Dec. 27, 2013

(65) Prior Publication Data
US 2015/0340609 A1 Nov. 26, 2015

(30) Foreign Application Priority Data
Jun. 22, 2012 (JP) .................................. 2012-141049

(51) Int. Cl.
H01L 45/00 (2006.01)

(52) U.S. Cl.
CPC ........ *H01L 45/1253* (2013.01); *H01L 45/085* (2013.01); *H01L 45/1206* (2013.01);
(Continued)

(58) Field of Classification Search
CPC .. H01L 45/1206; H01L 45/1233; H01L 45/14
See application file for complete search history.

(56) References Cited

U.S. PATENT DOCUMENTS 8,129,704 B2 3/2012 Phatak et al.
8,574,956 B2 11/2013 Phatak et al.
(Continued)

FOREIGN PATENT DOCUMENTS

CN 102576709 7/2012
JP 2008-244397 10/2008
(Continued)

OTHER PUBLICATIONS

International Search Report PCT/JP2013/065376 dated Aug. 27, 2013.
(Continued)

*Primary Examiner* — Matthew Reames
(74) *Attorney, Agent, or Firm* — Young & Thompson

(57) ABSTRACT

The present invention provides a non-volatile switching element that can be applied to a programmable-logic wiring changeover switch and in which an electrochemical reaction is used. Of the two electrodes for applying a bias voltage to the variable resistance layer of the non-volatile switching element, the electrode that does not feed metal ions to the variable resistance layer when the switch is in the ON state is made from a ruthenium alloy. The ruthenium alloy includes ruthenium and a metal in which the standard Gibbs energy of forming ΔG when metal ions are generated from the metal is higher in the negative direction than ΔG of ruthenium. As a result, it becomes possible to maintain the low-resistance state in the ON state for a longer period of time without increasing the amount of electrical current required when a switch is made between the ON state and the OFF state.

3 Claims, 16 Drawing Sheets

(52) U.S. Cl.
CPC .......... *H01L 45/1233* (2013.01); *H01L 45/14* (2013.01); *H01L 45/146* (2013.01); *H01L 45/16* (2013.01); *H01L 45/1616* (2013.01); *H01L 45/1675* (2013.01)

(56) References Cited

U.S. PATENT DOCUMENTS

| | | | |
|---|---|---|---|
| 8,766,233 | B2 | 7/2014 | Sakotsubo et al. |
| 8,921,156 | B2 | 12/2014 | Phatak et al. |
| 9,029,825 | B2 | 5/2015 | Tada et al. |
| 9,070,867 | B2 | 6/2015 | Phatak et al. |
| 9,276,211 | B2 | 3/2016 | Phatak et al. |
| 2007/0290186 | A1* | 12/2007 | Bourim .................. H01L 45/12 257/4 |
| 2009/0087339 | A1* | 4/2009 | Shinriki .................. C23C 16/18 420/462 |
| 2010/0055433 | A1* | 3/2010 | Shinriki .................. C23C 16/34 428/220 |
| 2010/0073025 | A1* | 3/2010 | Tanamoto .......... H03K 19/1776 326/41 |
| 2010/0096756 | A1* | 4/2010 | Tagami ............. H01L 21/76843 257/762 |
| 2012/0199805 | A1 | 8/2012 | Sorada et al. |
| 2012/0280200 | A1 | 11/2012 | Tada et al. |
| 2013/0009123 | A1 | 1/2013 | Tada et al. |

FOREIGN PATENT DOCUMENTS

| | | |
|---|---|---|
| JP | 2010-245132 | 10/2010 |
| JP | 2011/520265 A | 7/2011 |
| JP | 2011-211165 | 10/2011 |
| JP | 2011-238875 A | 11/2011 |
| WO | 0048196 | 8/2000 |
| WO | 2011/043448 A1 | 4/2011 |
| WO | 2011058947 | 5/2011 |
| WO | 2011115188 | 9/2011 |
| WO | 2011/158821 A1 | 12/2011 |
| WO | 2012023269 | 2/2012 |
| WO | 2012043502 | 4/2012 |

OTHER PUBLICATIONS

Japanese Office Action, dated Apr. 3, 2018, from corresponding Japanese application No. 2017-118654.

* cited by examiner

Fig. 8A
(STEP 1)
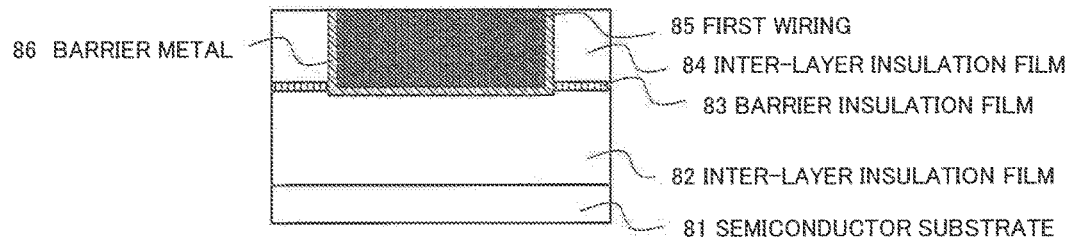
(STEP 2)
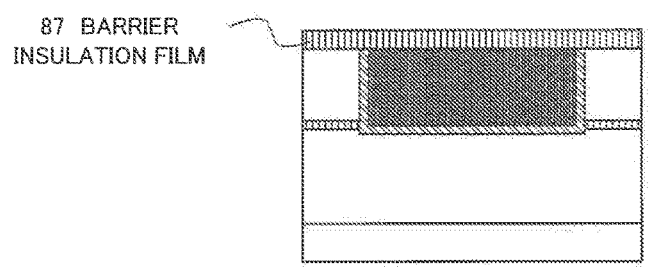
(STEP 3)
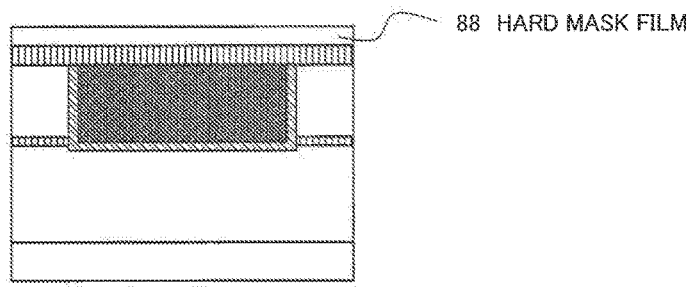
(STEP 4)
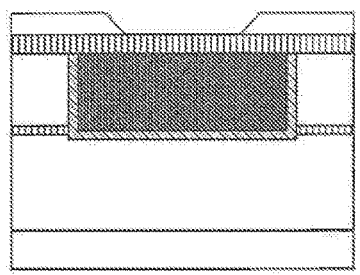

Fig. 8B
(STEP 5)
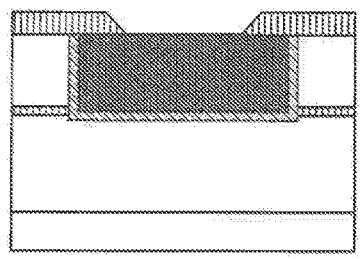
(STEP 6)
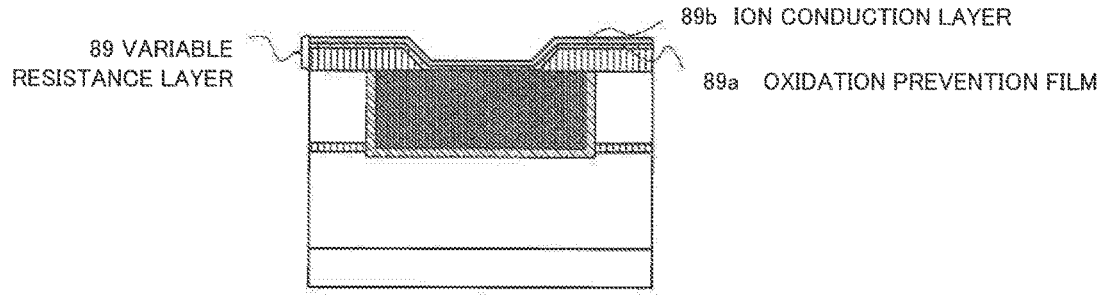
89 VARIABLE RESISTANCE LAYER
89b ION CONDUCTION LAYER
89a OXIDATION PREVENTION FILM
(STEP 7)
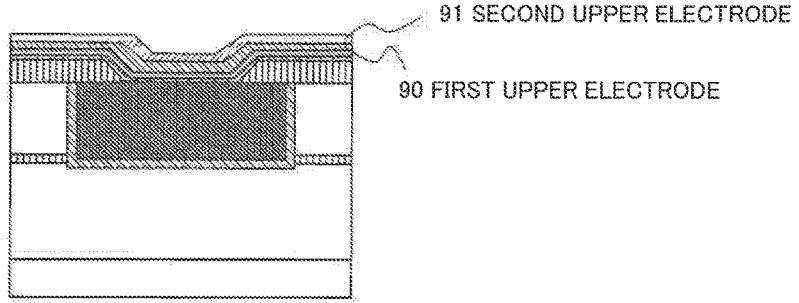
91 SECOND UPPER ELECTRODE
90 FIRST UPPER ELECTRODE
(STEP 8)
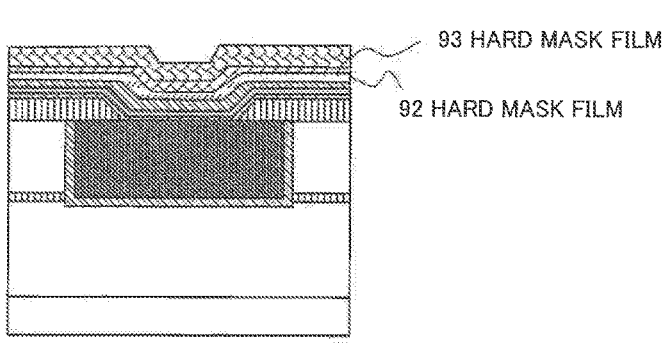
93 HARD MASK FILM
92 HARD MASK FILM Fig. 8C
(STEP 9)
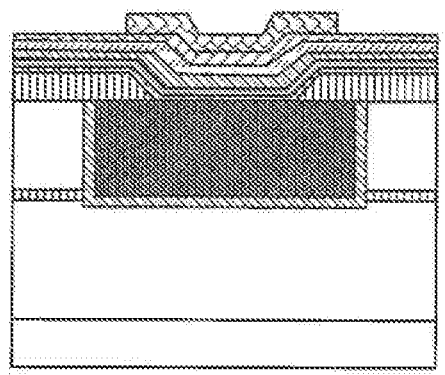
(STEP 10)
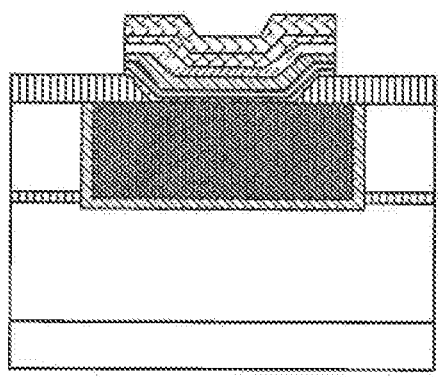
(STEP 11)
104 PROTECTION
INSULATION FILM
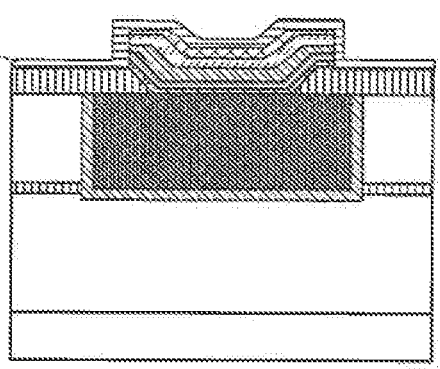

(STEP 12)

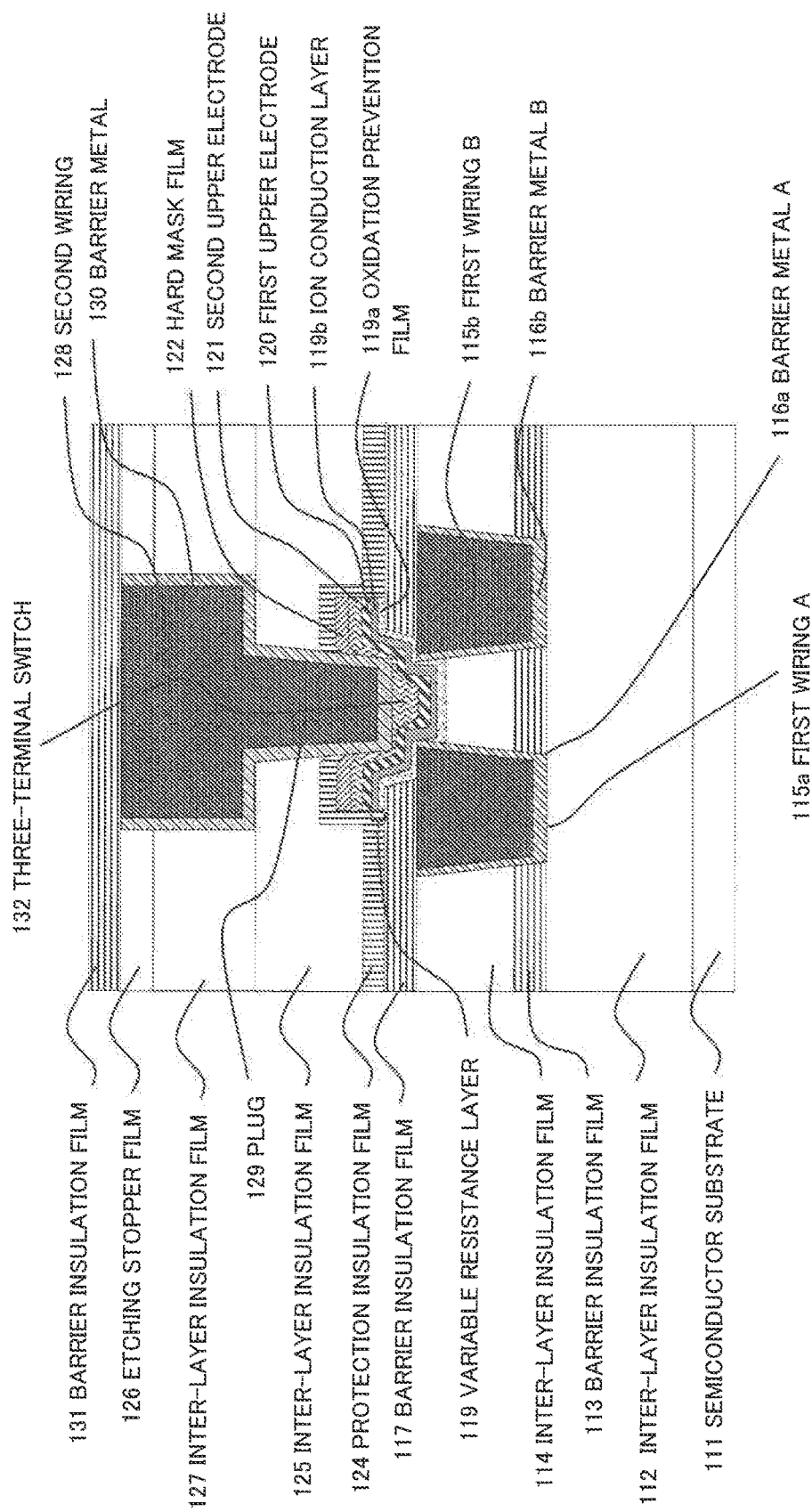

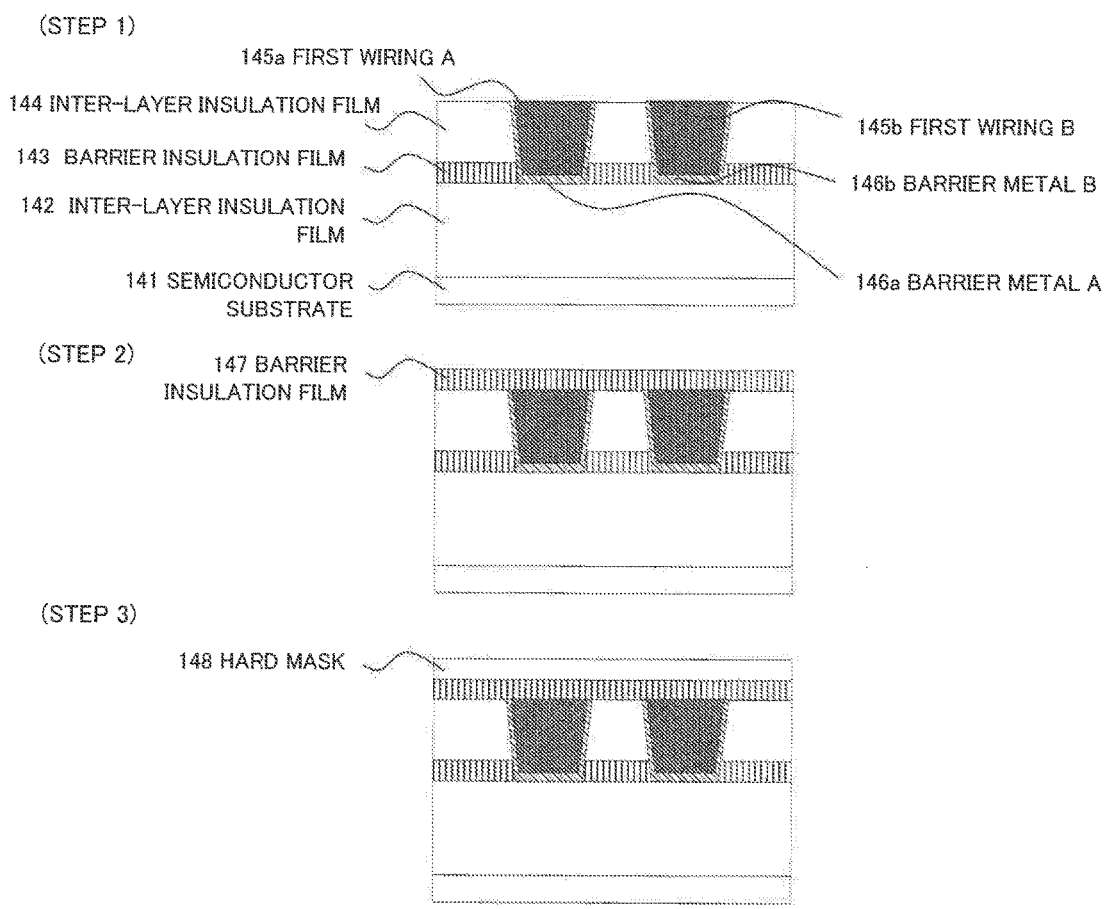

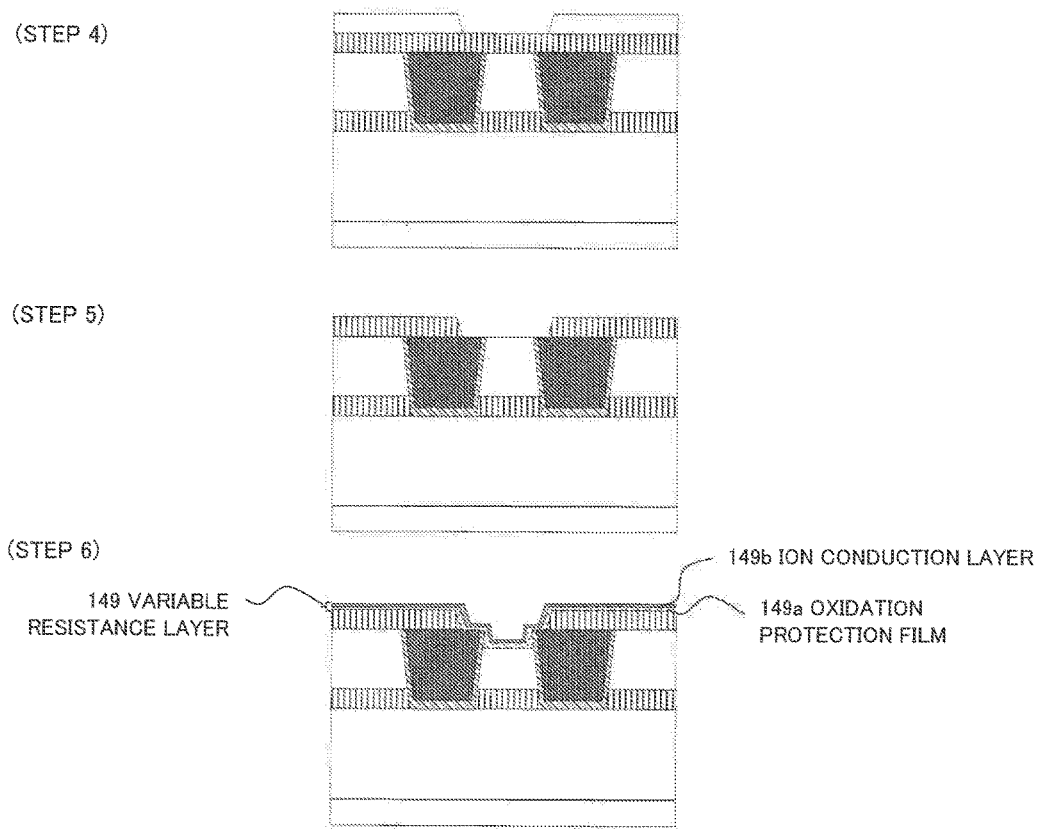

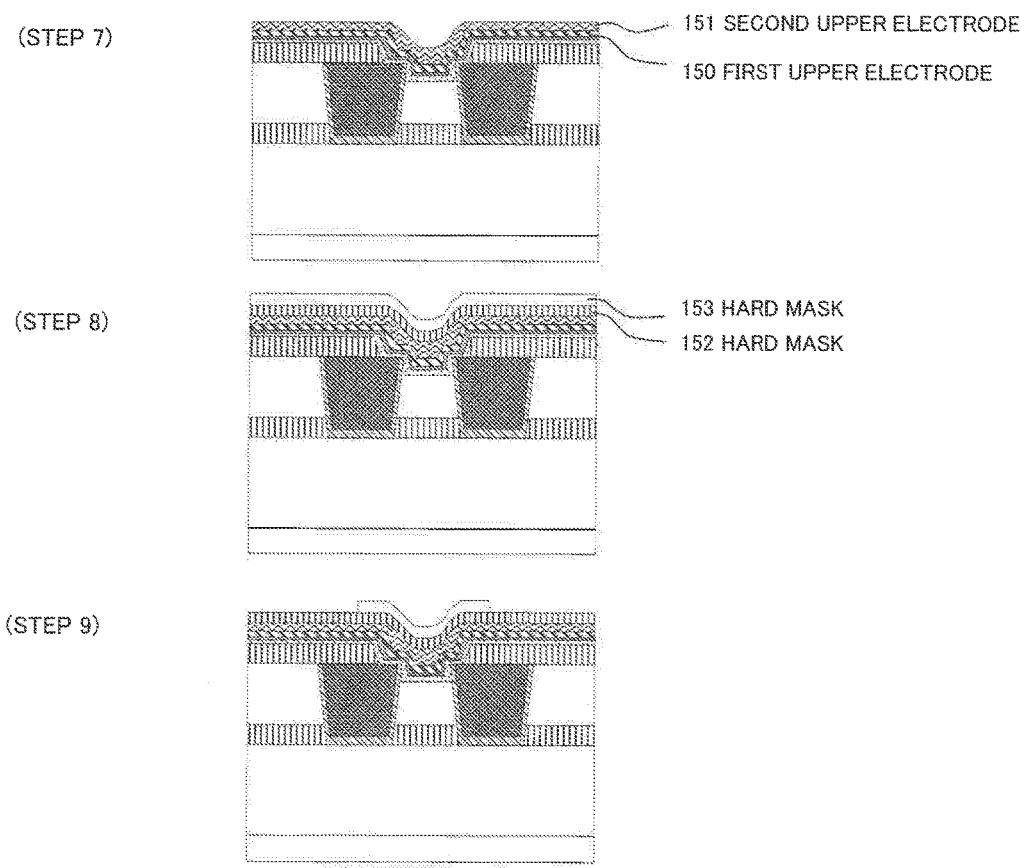

SWITCHING ELEMENT AND METHOD FOR MANUFACTURING SWITCHING ELEMENT

TECHNICAL FIELD

The invention relates to a switching element and a method for manufacturing the switching element. In particular, the invention relates to a variable resistance element and a manufacturing method thereof which enable resistance variation from the OFF state to the ON state, which is suitable for application to a non-volatile switching element configuring an electronic device such as programmable-logic, memory, or the like, and in which a metal ion is generated due to metal oxidation, the generated metal ion is introduced, metal deposition due to reduction of the metal ion is utilized, metal bridge is formed in an ion conduction layer.

BACKGROUND ART

It is necessary that a size of a switch mutually connecting logic cells has to be reduced and the ON resistance thereof has to be reduced in order to diversify a function of the programmable-logic and to promote mounting on an electric apparatus. A non-volatile switching element, which switches from the OFF state to the ON state, has been developed in which a metal is deposited in an ion conduction layer conducting a metal ion to form a metal bridge in the ion conduction layer by using an electrochemical reaction. It is known that the non-volatile switching element has smaller size and lower ON resistance compared with a conventional semiconductor switch. As the non-volatile switching element, "two-terminal switch (FIG. 1A)" disclosed in Patent Literature 1 and "three-terminal switch" disclosed in Patent Literature 2 are known. the "two-terminal switch" shown in FIG. 1A has a structure in which an ion conduction layer is sandwiched between a first electrode supplying a metal ion and a second electrode supplying no metal ion, in a step of changing the switching element from the "OFF" state to the "ON" state. In the step of changing the switching element from the "OFF" state to the "ON" state, the second electrode is grounded and a positive voltage is applied to the first electrode. In the first electrode side, a metal is ionized and a generated metal ion is introduced into the ion conduction layer. In the second electrode side, the metal ion is reduced and the metal deposits. Since the deposited metal forms a metal bridge extending from the second electrode to the first electrode in the ion conduction layer, switching from the "OFF" state to the "ON" state is achieved. In a step of changing the switching element from the "ON" state to the "OFF" state, the second electrode is grounded and a negative voltage is applied to the first electrode. At this time the deposited metal is re-ionized, re-deposition of the metal progresses due to reduction of the metal ion, consequently the metal bridge disappears and switching from the "ON" state to the "OFF" state is achieved.

Since the "two-terminal switch" has a simple structure, a manufacturing process is simple and the "two-terminal switch" having an element size of nanometer order can be manufactured. Since the "three-terminal switch" includes, as exemplified in FIG. 3 (FIG. 1B) in Patent Literature 3, a structure in which two second electrodes of the "two-terminal switch" are integrated, high reliability is acquired.

A porous polymer including silicon, oxygen, and carbon, as primary components is desirable as the ion conduction layer. The porous polymer ion conduction layer can keep an "insulation breakdown voltage" high even though the metal bridge is formed, and therefore excels in operation reliability (Patent Literature 3).

It is necessary to decrease "element size" and simplify manufacturing steps in response to densification of wiring in order to mount (apply) the non-volatile switching element as a programmable-logic wiring changeover switch. The most advanced semiconductor device mainly employs copper as a wiring material which is used for forming of multi-layered wiring. Development of a technique of effectively forming a non-volatile switching element such as variable resistance element in a copper wiring of a multi-layered structure is required. Non-Patent Literature 1 discloses a technology of integrating a switching element using an electrochemical reaction into a semiconductor device. Non-Patent Literature 1 describes a structure in which a copper wiring on a semiconductor substrate is used as a first electrode of the switching element when the first electrode of the switching element is manufactured by using copper. If the structure is used, a step in which the first electrode is newly formed in addition to the copper wiring can be omitted. A mask for a "patterning step" used for forming the first electrode is not required, and two photo masks (PR) used in a step of forming the "ion conduction layer" and a step of forming the "second electrode" are only added in order to manufacture a variable resistance element having a structure of the "two-terminal switch".

When the copper wiring on the semiconductor substrate is used as the first electrode of the switching element, if the "porous polymer ion conduction layer" made from a porous polymer including silicon, oxygen, and carbon as primary components is directly formed on the copper wiring, a surface of the copper wiring is oxidized. After a thin metal film which works as an oxidation sacrifice layer is formed on the copper wiring surface in order to prevent oxidation of the surface of the copper wiring, the "porous polymer ion conduction layer" is formed. The thin metal film is oxidized by oxygen during the step of forming the "porous polymer ion conduction layer" and changed into a "thin film of metal oxide with ion conductivity". As exemplified in FIG. 4 (FIG. 1C) in Patent Literature 3, the "thin film of metal oxide" generated by oxidation of the "thin metal film which works as the oxidation sacrifice layer" composes the ion conduction layer with the "porous polymer ion conduction layer" which is formed thereon.

When the first electrode of the switching element is manufactured by using copper, the second electrode, which does not supply a metal ion during changeover of the switching element from the "OFF" state to the "ON" state, is made from platinum or gold which is difficult to be oxidized or ruthenium which keeps conductivity even though it is oxidized. In Non-Patent Literature 1, the second electrode is formed by using ruthenium which is suitable for manufacturing.

CITATION LIST

Patent Literature

[PTL 1] International Publication No. 00/48196
[PTL 2] International Publication No. 2012/043502
[PTL 3] International Publication No. 2011/058947

Non Patent Literature

[NPL 1] IEEE TRANSACTION ON ELECTRON DEVICES, Vol. 57, pp. 1987-1995, 2010

SUMMARY OF INVENTION

Technical Problem

The non-volatile switching element, which switches from the "OFF" state to the "ON" state by depositing a metal in the ion conduction layer conducting a metal ion and forming the metal bridge in the ion conduction layer, and switches from the "ON" state to the "OFF" state by dissolving the metal bridge formed in the ion conduction layer, by using an electrochemical reaction, is applicable to the programmable-logic wiring changeover switch. A holding ability to maintain the "ON" state or the "OFF" state for about 10 years in a state without application of voltage/current, after at an initial programming rewriting in the "ON" state or the "OFF" state, is required for the non-volatile switching element, when used as the programmable-logic wiring changeover switch. Although it is impossible in principle to reduce an applied bias voltage to generate an electrochemical reaction since the voltage depends on metal used for formation of the metal bridge, it is desired to reduce an "amount of current used for rewriting".

The "amount of current used for rewriting" is proportional to the total amount of metal composing the metal bridge which is formed in the ion conduction layer. In order to form a "thick metal bridge", a lot of total amount of metal composing the metal bridge is required and a lot of the "amount of current used for rewriting" is required. When the "amount of current used for rewriting" is small, the total amount of the metal composing the metal bridge becomes small, and the metal bridge to be formed becomes thin. If the "thin metal bridge" is used, a part which becomes thin is generated in the "thin metal bridge", while a long period of time is elapsed, due to "electro-migration" and "ionization of the metal" caused by an electrical current flowing in the "thin metal bridge", and a resistance value of "non-volatile switching element" is quickly increased. Since the "electro-migration" and the "ionization of the metal" are further accelerated as temperature rises, it may lead to finally occur a disconnection part in the "thin metal bridge".

In the non-volatile switching element, trade-off exists between reduction of the "amount of current used for rewriting" (lowering in power) and a holding ability for holding a low resistance value of the "ON" state for a long period of time (enhancing reliability). In order to achieve long-term reliability more than 10 years and to reduce the "amount of current used for rewriting" (lowering in power), the structure of the non-volatile switching element has to be optimized.

The invention is to solve the above mentioned problem. An object of the invention is to provide a variable resistance element which has a high holding ability even when programming is carried out using a low electrical current, and a rewritable semiconductor device using the element.

Solution to Problem

In order to achieve the object, the switching element (variable resistance element) employs a following structure described below.

The variable resistance element according to the present invention characterized in that:

in a variable resistance element having a first electrode, a second electrode, and a variable resistance film located between the electrodes, the second electrode is an electrode that is made from an alloy including ruthenium.

The alloy including ruthenium is preferably an alloy of ruthenium and a metal whose standard Gibbs energy of forming for oxidation is higher in the negative direction than the energy of ruthenium. For example, the alloy including ruthenium is preferably an alloy of ruthenium and at least one metal selected from the group of titanium, tantalum, aluminum, manganese, zirconium, hafnium, magnesium, cobalt, copper, and zinc.

It is more preferable that content rate of ruthenium in the alloy is not less than 50 atm % and not more than 95 atm %.

In addition, in the variable resistance element according to the present invention, it is desirable that the variable resistance film is an ion conduction layer conducting a metal ion, and that configuration such that the first electrode includes copper is selected.

In the configuration, the ion conduction layer is preferably a polymer layer including at least silicon, oxygen, and carbon as primary components, and relative permittivity of the polymer including at least silicon, oxygen, and carbon as primary components is not less than 2.1 and not more than 3.0.

It is desirable that the variable resistance element according to the present invention is manufactured by a following manufacturing method.

The desirable manufacturing method is a method for manufacturing a variable resistance element including a first electrode, a second electrode, and a variable resistance film located between the electrodes, and the method for manufacturing a variable resistance element is characterized in that the second electrode is an electrode made from an alloy including ruthenium, and in steps of manufacturing the electrode made from the alloy including ruthenium, after a film made from a metal whose standard Gibbs energy of forming for oxidation is higher in the negative direction than the energy ruthenium is formed on the variable resistance film, a film made from the alloy including ruthenium is formed on the upper face thereof, and alloying between the film made from the metal and the film made from the alloy including ruthenium is generated to generate the alloy including ruthenium.

Specifically, a desirable method for manufacturing may include a following embodiment. For example, a method for manufacturing a variable resistance element including a first electrode, a second electrode, and a variable resistance film located between the electrodes is characterized in that the second electrode is an electrode made from the alloy including ruthenium, and in steps of manufacturing the electrode made from the alloy including ruthenium.

a titanium film of 0.5 nm thick is formed on the variable resistance film, a ruthenium alloy of 10 nm thick including 50 atm % tantalum is formed on the upper surface thereof, and heat treatment at the temperature of 400° C. or less is carried out to make alloy through solid-phase diffusion. The rewritable semiconductor device using the switching element (variable resistance element) according to the present invention can employ two embodiments described below.

A first embodiment of the rewritable semiconductor device using the switching element (variable resistance element) according to the present invention employs the following structure.

A semiconductor device includes a two-terminal variable resistance element in a multi-layered copper wiring layer on a semiconductor substrate, and is characterized in that the multi-layered copper wiring layer includes at least copper wiring and a copper plug, the two-terminal variable resistance element has a structure in which an ion conduction layer is located between an upper electrode and a lower electrode, the copper wiring concurrently serves as the lower electrode and a barrier insulation film is arranged on the copper wiring, the barrier insulation film is made from silicon carbonitride, an opening, extending to the copper wiring, is arranged in the barrier insulation film, the ion conduction layer and the upper electrode are embedded in order only in the opening, the ion conduction layer has a laminated structure of a compound including oxygen, the ion conduction layer is composed of a second ion conduction layer which is in contact with the copper wiring and a first conduction layer which is in contact with the upper electrode, the second ion conduction layer is made from titanium oxide, aluminum oxide, a lamination thereof, or mixture layers thereof, the first ion conduction layer is made from a polymer film that includes at least silicon, oxygen, and carbon as primary components, and whose relative permittivity is not less than 2.1 and not more than 3.0, the upper electrode is in contact with the copper plug through a barrier metal, and the upper electrode is made from an alloy including ruthenium.

A second embodiment of the rewritable semiconductor device using the switching element (variable resistance element) according to the present invention employs the following structure.

A semiconductor device includes a three-terminal variable resistance element in a multi-layered copper wiring layer on a semiconductor substrate, and is characterized in that the multi-layered copper wiring layer includes at least copper wiring and a copper plug, the three-terminal variable resistance element has a structure in which an ion conduction layer is located between one upper electrode and two lower electrodes, the copper wiring concurrently serves as the lower electrode and a barrier insulation film is arranged on the copper wiring, the barrier insulation film is made from silicon carbonitride, one opening, extending to both of the two lower electrodes, is arranged in the barrier insulation film, the ion conduction layer and the upper electrode are embedded in order only in the opening, the ion conduction layer has a laminated structure of a compound including oxygen, the ion conduction layer is composed of a second ion conduction layer is in contact with the copper wiring and a first conduction layer is in contact with the upper electrode, the second ion conduction layer is made from titanium oxide, aluminum oxide, a lamination thereof, or mixture layers thereof, the first ion conduction layer is made from a polymer film that includes at least silicon, oxygen, and carbon as primary components, and whose relative permittivity is not less than 2.1 and not more than 3.0, the upper electrode is in contact with the copper plug through a barrier metal, and the upper electrode is made from an alloy including ruthenium.

(Operation)

Since adhesion between the metal bridge and the second electrode is improved by adding a metal to ruthenium forming the second electrode, stability of the element and holding ability are improved even though programming is carried out using a low electrical current.

Since the second electrode includes ruthenium, stable reset is possible.

When a relative resistance of an inactive electrode is increased due to alloying of the second electrode, it is easy to generate heat due to rewriting current, and Joule heat which is generated in the metal bridge due to heat confinement effect becomes difficult to be diffused. Therefore an effect in which the rewriting current required at the time of rewriting is reduced is generated.

As described above, power reduction can coexist with high holding ability. Since high programming power is necessary if only the holding ability is improved, programming can be effectively carried out using a small electrical current by improving thermal efficiency by an alloy electrode.

Advantageous Effects of Invention

The switching element (variable resistance element) of the present invention can improve the holding ability of the metal bridge even when programming is carried out using a low electrical current. Thereby reliability in the case in which the switching element of the present invention is applied to a programmable-logic wiring changeover switch is improved, and suppression of electrical power consumption during operation can coexist with high reliability.

BRIEF DESCRIPTION OF DRAWINGS

FIG. 8A is a cross sectional view schematically illustrating a step 1 to a step 4 in a manufacturing process of the semiconductor device including the "two-terminal switch" formed in the multi-layered wiring layer in the first exemplary embodiment.

FIG. 8B is a cross sectional view schematically illustrating a step 5 to a step 8 in the manufacturing process of the semiconductor device including the "two-terminal switch" formed in the multi-layered wiring layer in the first exemplary embodiment.

FIG. 8C is a cross sectional view schematically illustrating a step 9 to a step 11 in the manufacturing process of the semiconductor device including the "two-terminal switch" formed in the multi-layered wiring layer in the first exemplary embodiment.

FIG. 9 is a cross sectional view schematically illustrating an example of a structure of a semiconductor device including a "three-terminal switch" formed in a multi-layered wiring layer in a second exemplary embodiment.

FIG. 10A is a cross sectional view schematically illustrating a step 1 to a step 3 in a manufacturing process of the semiconductor device including the "three-terminal switch" formed in the multi-layered wiring layer in the second exemplary embodiment.

FIG. 10B is a cross sectional view schematically illustrating a step 4 to a step 6 in the manufacturing process of the semiconductor device including the "three-terminal switch" formed in the multi-layered wiring layer in the second exemplary embodiment.

FIG. 10C is a cross sectional view schematically illustrating a step 7 to a step 9 in the manufacturing process of the semiconductor device including the "three-terminal switch" formed in the multi-layered wiring layer in the second exemplary embodiment.

Figure 1A:
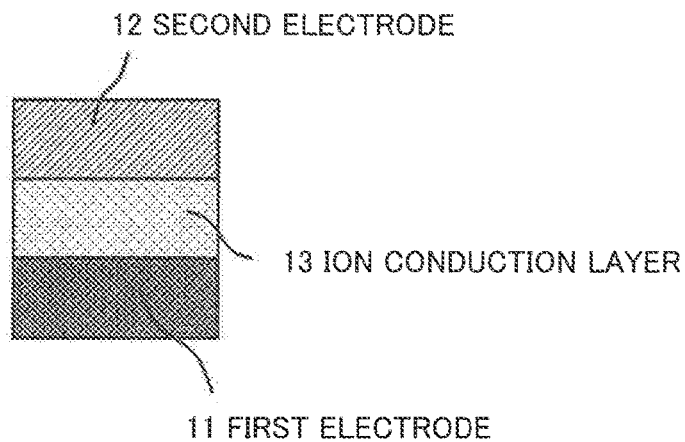
FIG. 1A is a cross sectional view schematically illustrating an example of a switching element structure employing a structure of a conventional "two-terminal switch".
Figure 1B:
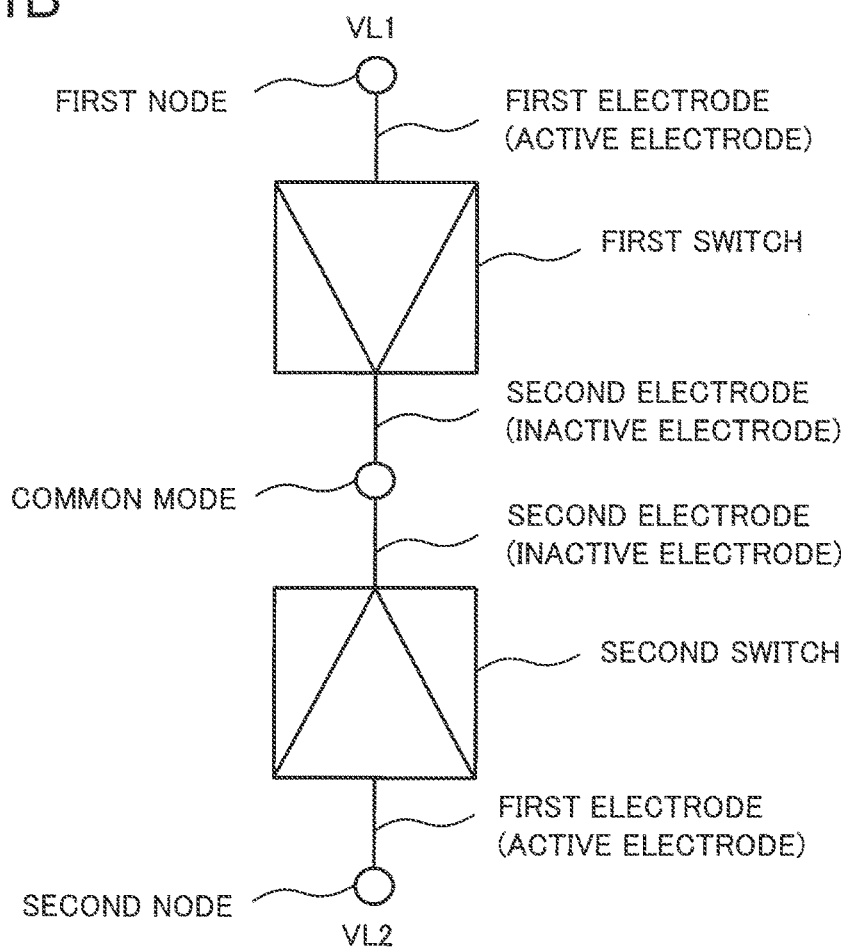
FIG. 1B is a diagram illustrating an example of a switching element employing a structure of a conventional "three-terminal switch" and schematically illustrating a structure in which second electrodes of the two "two-terminal switches" are integrated.
Figure 1C:
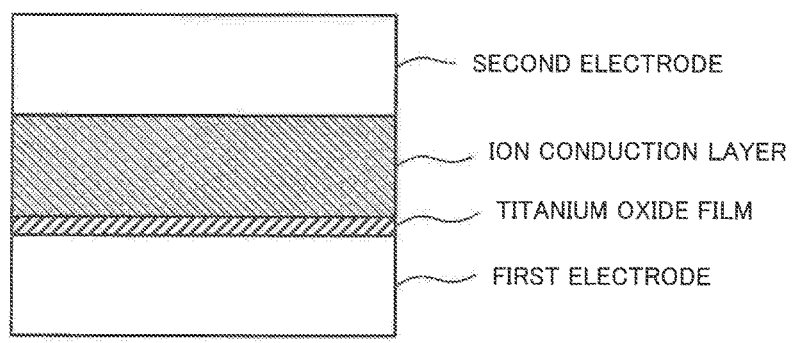
FIG. 1C is an example of a switching element structure employing a structure of the conventional "two-terminal switch", and is a cross sectional view schematically illustrating a structure including "porous polymer ion conduction layer" which is formed on a upper face of a titanium oxide as a "metal oxide film".

In the figures above described, following signs have meanings described below.

REFERENCE SIGNS LIST 11, 21, 31, 41 first electrode
12, 22, 32, 42 second electrode
13, 23, 33, 59b, 89b, 119b, 149b ion conduction layer
43 first ion conduction layer
45 second ion conduction layer
44 metal layer
35 metal ion
34 metal bridge
46 low resistance silicon substrate
51, 81, 111, 141 semiconductor substrate
52, 54, 65, 67, 82, 84, 95, 97, 112, 114, 125, 127, 142, 144, 155, 157 inter-layer insulation film
53, 57, 71, 83, 87, 101, 113, 117, 131, 143, 147, 161 barrier insulation film
56, 70, 86, 100, 130, 160 barrier metal
116a, 146a barrier metal A
116b, 146b barrier metal B
55, 55 first wiring
55a first lower electrode
115a, 145a first wiring A
115b, 145b first wiring B
59, 89, 119, 149 variable resistance layer
68, 98, 128, 158 second wiring
63, 88, 92, 93, 122, 148, 152, 153 hard mask film
66, 96, 126, 156 etching stopper film
59a, 89a, 119a, 149a oxidation prevention film
60, 90, 120, 150 first upper electrode
61, 91, 121, 151 second upper electrode
64, 104, 124, 154 protective insulation film
69, 99, 129, 159 plug
72 two-terminal switch
132 three-terminal switch

DESCRIPTION OF EMBODIMENTS

The present invention is described below in detail.

First Exemplary Embodiment

Figure 2:
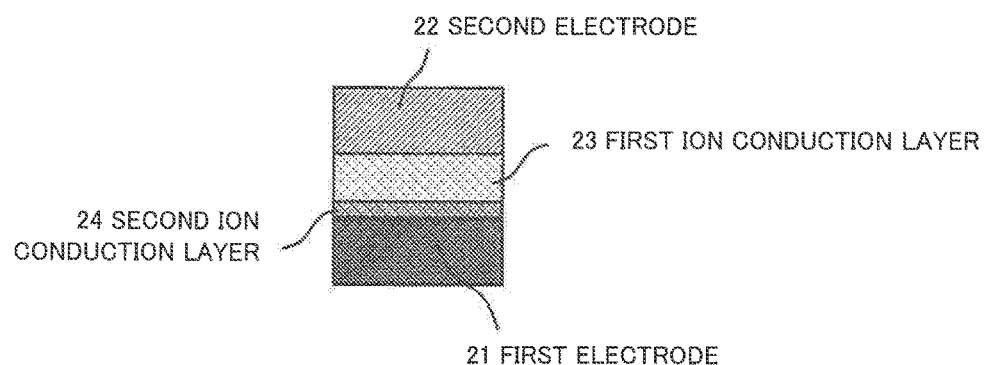
FIG. 2 is a cross sectional view schematically illustrating an example of a switching element structure employing a structure of a "two-terminal switch" of a first exemplary embodiment.

A structure of a "two-terminal switch" of a first exemplary embodiment is explained. FIG. 2 is a cross sectional view schematically illustrating an example of a switching element structure employing the structure of the "two-terminal switch" of the first exemplary embodiment.

The switching element has a structure including a first electrode 21, a second ion conduction layer 24 formed on a boundary face of the first electrode 21, a first ion conduction layer 23 being in contact with the second ion conduction layer 24, a second electrode 22 which is formed through the first electrode 21, the second ion conduction layer 24, and the first ion conduction layer 23. The first ion conduction layer 23 and the second ion conduction layer 24 are media for conducting a metal ion. It is desirable that a material of the second electrode 22 does not supply a metal ion to the first ion conduction layer 23 and the second ion conduction layer 24 when the second electrode 22 is grounded and a positive voltage is applied to the first electrode 21, during a step of switching from the "OFF" state to the "ON" state.

The first electrode 21 is made from copper. Copper wiring manufactured by a sputtering method, a chemical vapor deposition method (CVD method), an electrical plating method, or the like, is used as the first electrode 21.

The second ion conduction layer 24 is made from a metal oxide. Initially, a thin film of a metal composing the metal oxide is formed on the first electrode 21. When a SIOCH-based polymer film which includes silicon, oxygen, carbon, and hydrogen, and composes the first ion conduction layer 23 is formed on a surface of the thin film of the metal by using a plasma CVD method, oxygen existing in a deposition chamber oxides the thin film of the metal and changes it into the film of the metal oxide. Consequently, the second ion conduction layer 24 composed of the film of the metal oxide is generated between the first electrode 21 and the first ion conduction layer 23. A metal composing the metal oxide can be selected from a group of titanium, aluminum, zirconium, hafnium, and tantalum. These metals may be laminated and used as the thin film of the metal. The optimum thickness of the film of the metal is from 0.5 nm to 1 nm. If the thickness of the film is smaller than the optimum thickness, oxidation reaches a surface of the copper wiring through the thin film of the metal while the SIOCH-based polymer film is formed by the plasma CVD method. Consequently, the surface of the copper wiring is slightly oxidized. If the thickness of the film is larger than the optimum thickness, oxidation of the film of the metal is not completed during forming the SIOCH-based polymer film by the plasma CVD method, and the metal remains on the surface of the copper wiring.

The film of the metal which is used for manufacturing of the second ion conduction layer 24 is formed by the sputtering method, a laser ablation method, or the plasma CVD method. It is desirable that the film thickness of the second ion conduction layer 24 is not more than 50% of the thickness of the first ion conduction layer 23.

The first ion conduction layer 23 is made from the SIOCH-based polymer film which includes silicon, oxygen, carbon, and hydrogen and is formed by the plasma CVD method. Raw materials of cyclic organosiloxane and helium as a carrier gas are introduced into a reaction chamber, and application of RF power is started when supply of the two is stabilized and a pressure in the reaction chamber becomes constant. Supplied amount of the raw materials is 10 to 200 sccm, supply of helium is 500 sccm through a raw material carburetor, and 500 sccm is directly supplied into the reaction chamber using a different line.

As a metal material for manufacturing of the second electrode 22, ruthenium alloy is used in which titanium, tantalum, aluminum, manganese, zirconium, hafnium, magnesium, cobalt, copper, zinc, and the like, are added to ruthenium. It is desirable to select such that content ratio of ruthenium in the ruthenium alloy is more than 30 atm % and not more than 95 atm %, and is preferably from 50 atm % to 95 atm %. For example, the content ratio of ruthenium may be selected more than 30 atm % and not be more than 80 atm %. Two or more kinds of metals may be added to ruthenium.

The inventors has found it is desirable to select, as a metal to be added to ruthenium, a metal whose standard Gibbs energy of forming of a process in which a metal ion is generated from a metal (oxidation process) is higher in the negative direction than the energy of ruthenium. Titanium, tantalum, aluminum, manganese, zirconium, hafnium, magnesium, cobalt, copper, and zinc whose standard Gibbs energy of forming of a process in which a metal ion is generated from a metal (oxidation process) is higher in the negative direction than the energy of ruthenium are likely to spontaneously generate a chemical reaction (e.g. oxidation reaction) compared with ruthenium. Metal bridge adhesion is improved by alloying ruthenium and the added metals above described as a material forming the second electrode.

If the second electrode 22 is manufactured only by using the added metals, transition to the "OFF" state does not occur. Though transition from the "ON" state to the "OFF" state proceeds on the basis of an oxidation reaction (dissolution reaction) of copper forming the metal bridge, if standard Gibbs energy of forming of a process in which a metal ion is generated from a metal (oxidation process) of the added metal forming the second electrode 22 is higher in the negative direction than the energy of copper forming the metal bridge, oxidation reaction of the added metals forming the second electrode 22 proceeds in prior to oxidation reaction of copper forming the metal bridge. Therefore dissolution of the metal bridge does not proceed and the transition from the "ON" state to the "OFF" state does not occur.

The second electrode 22 has to be formed using the alloy of the added metals and ruthenium whose standard Gibbs energy of forming of a process in which a metal ion is generated from a metal (oxidation process) is higher in the negative direction than the energy of copper. Specifically, the result is acquired in which if a content amount of ruthenium in the alloy becomes 30 atm % or less, when a negative voltage is applied to the first electrode 21 in a transition process from the "ON" state to the "OFF" state, insulation breakdown of the ion conduction layer occurs and the transition to the "OFF" state becomes impossible.

It is understood that the larger an amount of the added metal is, the more stable the "ON" state becomes and stability is improved even though 5 atm % is added.

Compared with manufacturing the second electrode 22 only using ruthenium, regarding the step of switching from "ON" state to "OFF" state, composition range of the ruthenium alloy is preferably selected so that ruthenium content ratio ranges from 50 atm % to 95 atm % in order to improving stability of the "ON" state without deteriorating the switching property.

It is desirable the second electrode is formed by the sputtering method. When an alloy is formed by the sputtering method, a method of using an alloy target of ruthenium and the added metals, a co-sputtering method of concurrently sputtering a ruthenium target and a target of the added metals in the same chamber, or an inter-mixing method of forming the thin film of the added metals in advance, forming ruthenium thereon by using the sputtering method and alloying them by energy of colliding atoms is available. If the co-sputtering method and the inter-mixing method are used, composition of an alloy can be changed. When the inter-mixing method is used, heat treatment at the temperature of 400° C. or less is preferably carried out for "flattening" of a mixture state, after ruthenium coating is completed.

Since effect of addition of the metal whose standard Gibbs energy of forming is high in the negative direction is decreased if copper which is a component of the metal bridge is mixed in the second electrode 22, a metal to be added to ruthenium is preferably a material having a barrier property against copper and a copper ion. The metal is, for example, tantalum, titanium, manganese, or the like. Tantalum nitride, titanium nitride or manganese nitride in which tantalum, titanium or manganese is partially nitrided, respectively, may be added to ruthenium.

Figure 3:
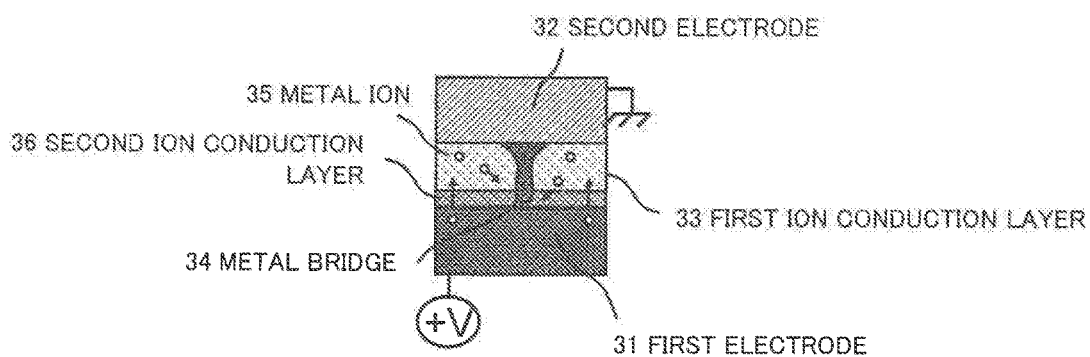
FIG. 3 is a cross sectional view schematically illustrating a mechanism in which a "metal bridge" is formed in an "ion conduction layer" during a switching step from an "OFF" state to an "ON" state, in the switching element structure employing the structure of the "two-terminal switch" of the first exemplary embodiment.

According to FIG. 3, a method for driving a switching element employing a structure of the "two-terminal switch" of the first exemplary embodiment is explained.

When the second electrode 32 is grounded and a positive voltage is applied to the first electrode 31, the metal of the first electrode 31 changes into a metal ion 35 through the second ion conduction layer 36 and dissolves in the first ion conduction layer 33. The metal ion 35 in the second ion conduction layer 36 and the first ion conduction layer 33 deposits on a surface of the second electrode 32 to be the metal bridge 34, and the deposited metal bridge 34 connects the first electrode 31 to the second electrode 32. When the deposited metal bridge 34 electrically connects between the first electrode 31 and the second electrode 32, the "two-terminal switch" becomes the "ON" state.

If the second electrode 32 is grounded in the "ON" state and a negative voltage is applied to the first electrode 31, the metal bridge 34 dissolves in the second ion conduction layer 36 and the first ion conduction layer 33 as the metal ion 35, and a part of the metal bridge 34 is cut. At this time, the metal ion 35 is collected into the second ion conduction layer 36, metal 34 dispersed in the first ion conduction layer 33, and the first electrode 31. Thereby electrical connection between the first electrode 31 and the electrode 32 is disconnected, and the "two-terminal switch" goes into the "OFF" state. After switching into the "OFF" state, the second electrode 32 is grounded and a positive voltage just has to be applied to the first electrode 31 to switch from the "OFF" state to the "ON" state. The "two-terminal switch" may be put into the "ON" state by grounding the first electrode 31 and applying a negative voltage to the second electrode 32, and the "two-terminal switch" may be put into the "OFF" state by grounding the first electrode 31 and applying a positive voltage to the second electrode 32.

In a process in which the "two-terminal switch" is switched into the "ON" state, from a step before electrical connection is completely disconnected, change of an electrical property, for example, increase of resistance between the first electrode 31 and the second electrode 32 and change of capacitance between the electrodes occurs, and finally the electrical connection is disconnected.

Embodiment 1

Figure 4:
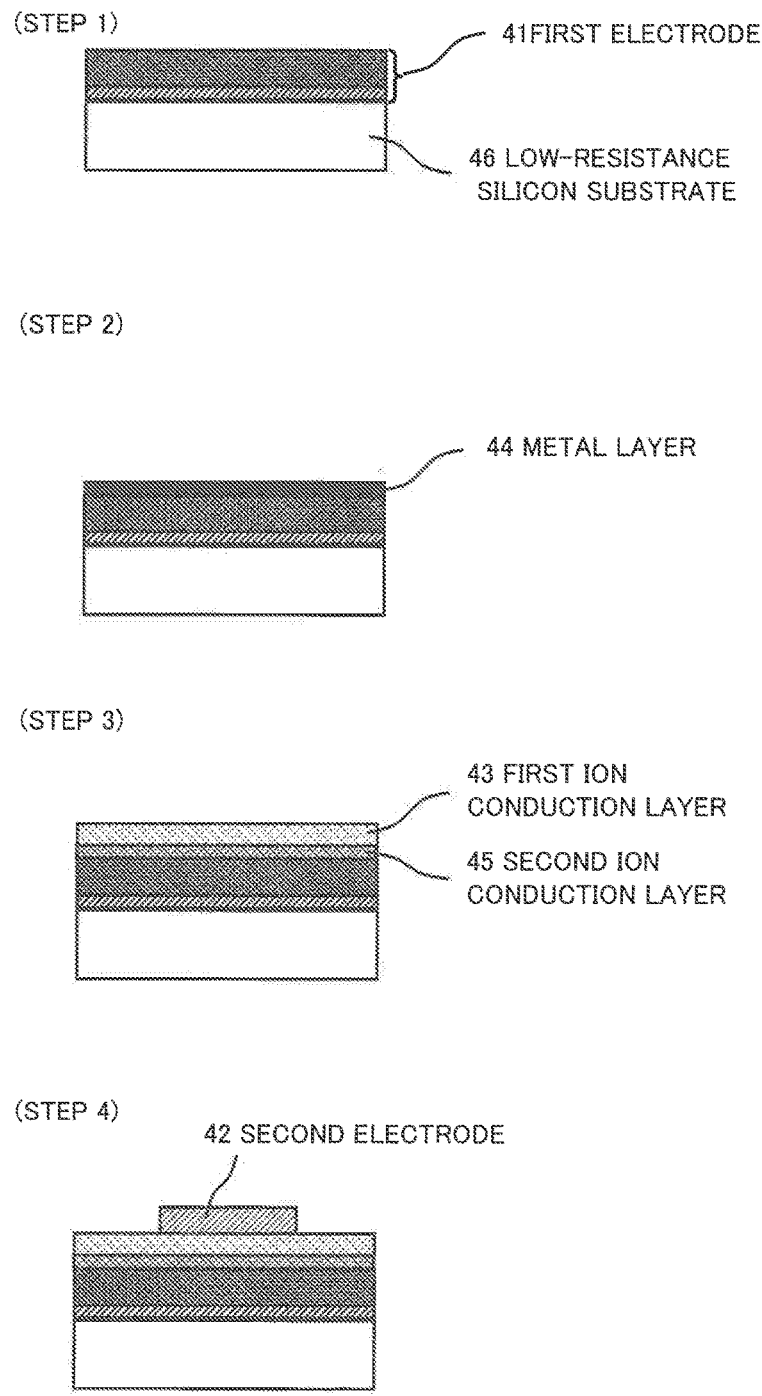
FIG. 4 is a cross sectional view schematically illustrating a step 1 to a step 4 in a manufacturing process of the switching element structure employing the structure of the "two-terminal switch" described in an embodiment 1 of the first exemplary embodiment.

The "best mode of exemplary embodiment" of a method of manufacturing a switching element employing the structure of the "two-terminal switch" of the first exemplary embodiment is described. According to FIG. 4, step 1 to step 4 of a manufacturing process of the switching element employing the structure of the "two-terminal switch" of the first exemplary embodiment are described.

(Step 1)
A tantalum film 20 nm thick is formed on a surface of a low resistance silicon substrate 46 by the sputtering method and a copper film 100 nm thick is formed on the tantalum film, thereby to form a first electrode 41.

(Step 2)
A titanium film or an aluminum film 0.5 nm thick, or the titanium film 0.5 nm thick and the aluminum film 0.5 nm thick, is formed by the sputtering method to form a metal layer 44.

(Step 3)
The SIOCH-based polymer film 6 nm thick including silicon, oxygen, carbon, and hydrogen is formed by the plasma CVD method, as an ion conduction layer 43. Raw materials of cyclic organosiloxane and helium as a carrier gas are introduced into a reaction chamber, and application of RF power is started when supply of the two is stabilized and a pressure in the reaction chamber becomes constant. Supplied amount of the raw materials is 10 to 200 sccm, supply of helium through a raw material carburetor is 500 sccm, and 500 sccm of helium is directly supplied into the reaction chamber from a different line. The metal layer 44 is oxidized by oxygen of the time of depositing the ion conduction layer 43 and becomes a second ion conduction layer 45 made from a metal oxide film.

(Step 4)
An alloy of ruthenium and titanium or an alloy of ruthenium and tantalum each having a film thickness of 30 nm is deposited on the ion conduction layer 43 by the co-sputtering method. A content amount of ruthenium in the "alloy of ruthenium and tantalum" is 50 atm %. On this occasion, the deposition is carried out through a shadow mask made of stainless or silicon, and a square second electrode 92, 30 µm to 150 µm on a side is formed.

Embodiment 2

A semiconductor device is explained in which a switching element employing the structure of the "two-terminal switch" of the first exemplary embodiment is formed in a multi-layered wiring layer.

Figure 5:
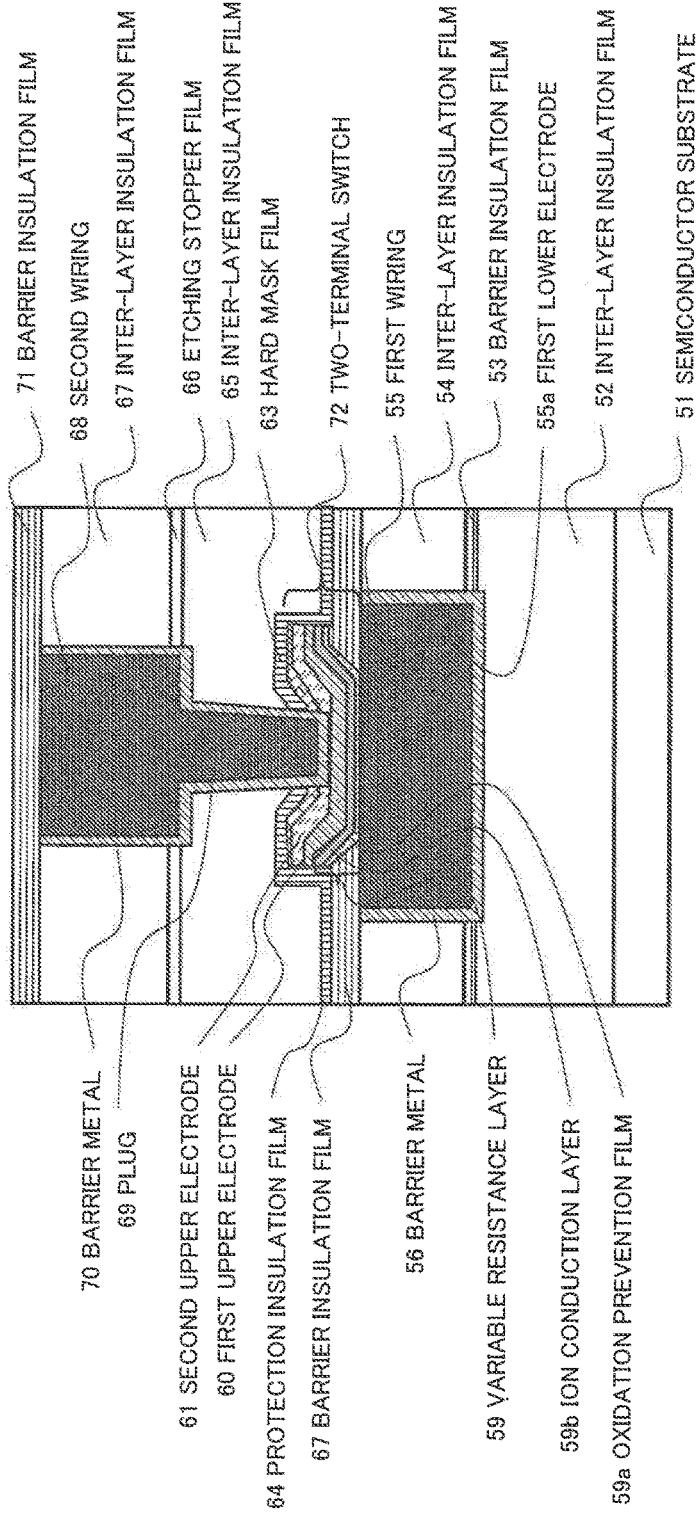
FIG. 5 is a cross sectional view schematically illustrating an example of a structure of a semiconductor device including the "two-terminal switch" manufactured in a multi-layered wiring layer in the first exemplary embodiment.

FIG. 5 is a partial cross sectional view schematically illustrating a structure of the semiconductor device in the embodiment 2 of the invention. The device includes a "two-terminal switch" 72 in the multi-layered wiring layer on a semiconductor substrate 51.

The multi-layer wiring layer includes, on the semiconductor substrate 51, an insulation laminated body in which an inter-layer insulation film 52, a barrier insulation film 53, an inter-layer insulation film 54, a barrier insulation 57, a protection insulation film 64, an inter-layer insulation film 65, an etching stopper film 66, an inter-layer insulation film 67, and a barrier insulation film 71 are laminated in this order. In the multi-layered wiring layer, a first wiring 55 is embedded in a wiring groove formed in the inter-layer insulation film 54 and the barrier insulation film 53 through a barrier metal 56. In the multi-layered wiring layer, a second wiring 68 is embedded in a wiring groove formed in the inter-layer insulation film 67 and the etching stopper film 66, and a plug 69 is embedded in a lower hole formed in the inter-layer insulation film 65, the protection insulation film 64, and a hard mask film 62, the second wiring 68 and the plug are integrated, and a side face and a bottom face of the second wiring and the plug 69 is coated by a barrier metal 70. In the multi-layer wiring layer, a two-terminal switch 72, in which an ion conduction layer 59, a first upper electrode 60, and a second upper electrode 61 are laminated in this order, is formed on the first wiring 55 forming a lower electrode, a wall face of an opening of the barrier insulation film 57 and the barrier insulation film 57 in the opening formed in the barrier insulation film 57, the hard mask film 62 is formed on the second upper electrode 61, a upper face and a side face of a laminated body including an oxidation prevention film 59a as an oxidation prevention film, an ion conduction layer 59b, the first upper electrode 60, the second upper electrode 61, and the hard mask film 62 are coated by the protection insulation film 64. When a part of the first wiring 55 is oxidized and a first lower electrode 55a is used as a lower electrode of the "two-terminal switch" 72, that is, when the first wiring 55 also serves as the first lower electrode 55a of the "two-terminal switch" 72, electrical resistance can be decreased while simplifying the number of steps. Only by forming at least 2PR mask set, as an additional step of a common copper damascene interconnect process, the "two-terminal switch" can be mounted, and low resistance of an element and low cost thereof can be concurrently achieved.

In the "two-terminal switch" 72, in a region of the opening formed in the barrier insulation film 57, the oxidation prevention film 59a is in direct contact with the first lower electrode 55a, the ion conduction layer 59b is in direct contact with the first upper electrode 60, the plug 69 is electrically in contact with the second upper electrode 61 through the barrier metal 70 on the second upper electrode 61. The "two-terminal switch" 72 carries out ON/OFF control by applying a voltage or flowing a current and, for example, carries out the ON/OFF control by using electrical field diffusion of a metal ion supplied from the metal forming the first wiring 55 into the oxidation prevention film 59*a* and the ion conduction layer inside 59*b*.

The semiconductor substrate 51 is a substrate on which a semiconductor element is formed. As a semiconductor substrate 91, a silicon substrate, a single crystal substrate, a SOI (Silicon on Insulator) substrate, a TFT (Thin Film Transistor) substrate, a substrate for manufacturing liquid crystal, or the like, is available. The inter-layer insulation film 52 is an insulation film which is formed on the semiconductor substrate 1. As the inter-layer insulation film 52, for example, a silicon oxide film, a low permittivity film (e.g. SiOCH film) whose relative permittivity is lower than relative permittivity of the silicon oxide film, or the like, is available. The inter-layer insulation film 52 may be a film in which a plurality of insulation films are laminated.

The barrier insulation film 53 is an insulation film with a barrier property which is located between inter-layer insulation films 52 and 54. The barrier insulation film 53 has a role of an etching stop layer while the wiring groove for the first wiring 55 is formed. A silicon nitride film, a SiC film, a silicon carbonitride film, or the like is available for the barrier insulation film 53. The wiring groove in which the first wiring 55 is embedded is formed in the barrier insulation film 53, and the first wiring 55 is embedded in the wiring groove via the barrier metal 56. The barrier insulation film 53 may be removed depending on selection of an etching condition for the wiring groove.

The inter-layer insulation film 54 is an insulation film which is formed on the barrier insulation film 53. As the inter-layer insulation film 54, for example, a silicon oxide film, low permittivity film (e.g. SiOCH film) whose relative permittivity is lower than the relative permittivity of a silicon oxide film, or the like, is available. The inter-layer insulation film 54 may be a film in which a plurality of insulation films are laminated. The inter-layer insulation film 54 includes a wiring groove in which the first wiring 5 is embedded, the first wiring 55 is embedded in the wiring groove via the barrier metal 56.

The first wiring 55 is wiring which is embedded, via the barrier metal 56, in the wiring groove which is formed in the inter-layer insulation film 54 and the barrier insulation film 53. The first wiring 55 also works as a lower electrode of the two-terminal switch 72 and is in direct contact with the ion conduction layer 59*a*. A bottom face of the oxidation prevention film 59*b* is in direct contact with the ion conduction layer 59*a* and an upper face thereof is in direct contact with the first upper electrode. As a metal forming the first wiring 55, a metal which can diffuse in the variable resistance layer 59 and is ion-conducting therein, for example, copper, etc. is used. The metal forming the first wiring 55 (e.g. copper) may be alloyed with aluminum.

The barrier metal 56 is a conductive film with a barrier property which coats a side face and a bottom face of the wiring in order to prevent the metal forming the first wiring 95 from diffusing into the inter-insulation film 54 and a lower layer. As the barrier metal 56, for example, a refractory metal and a nitride thereof such as tantalum, tantalum nitride, titanium nitride, tungsten carbonitride, or a laminated film thereof can be used.

The barrier insulation film 57 is formed on the inter-layer insulation film 54 including the first wiring 55, prevents oxidation of the metal forming the first wiring 55 (e.g. copper), prevents diffusion of the metal forming the first wiring 55 into the inter-layer insulation film 65, and has a role of an etching stop layer while the upper electrodes 61 and 60, and the variable resistance layer 59 are formed. The barrier insulation film 57 can employ, for example, a SiC film, a silicon carbonitride film, a silicon nitride film, or a laminated structure thereof. The barrier insulation film 57 preferably has the same material as that of the protection insulation film 64 and the hard mask film 62.

The oxidation prevention film 59*a* and the ion conduction layer 59*b* are films whose resistances are variable. A material is available, whose resistance is variable due to actions (diffusion, ion conduction, etc.) of a metal ion generated from the metal forming the first wiring (lower electrode) 55. When resistance change of the "two-terminal switch" 72 associated with switching into the "ON" state is carried out by depositing a metal caused by reduction of the metal ion, an ion-conducting film is used.

The ion conduction layer 59*b* is formed by the plasma CVD method. Raw materials of cyclic organosiloxane and helium as a carrier gas are introduced into a reaction chamber, and application of RF power is started when supply of the two is stabilized and a pressure in the reaction chamber becomes constant. Supplied amount of the raw materials is 10 sccm to 200 sccm, and helium of 500 sccm is supplied through a raw material carburetor.

The oxidation prevention film 59*a* has a role to prevent the metal forming the first lower electrode 55*a* from diffusing into the ion conduction layer 59*b* due to heating and plasma during deposition of the ion conduction layer 59*b*, and to prevent the first lower electrode 55*a* from being oxidized and diffusion thereof from being facilitated. A metal forming the oxidation prevention film 59*a*, for example, zirconium, hafnium, or aluminum, is oxidized while the ion conduction layer 59*b* is formed, and changes into zirconium oxide, hafnium oxide, aluminum oxide, or titanium oxide to become a part of the variable resistance layer 59. An optimum thickness of the metal film forming the oxidation prevention film 59*a* is 0.5 nm to 1 nm, a surface of copper wiring is slightly oxidized if the metal film is thinner than the film with optimum thickness, and the metal film is not completely oxidized during forming of the ion conduction layer 59*b* and remains as a metal if the metal film is thicker than the film with optimum thickness. The variable resistance layer 59 is formed on the first lower electrode 55*a*, a tapered face of the opening of the barrier insulation film 57, and the barrier insulation film 57. In the variable resistance layer 59, an outer periphery of the connection part between the first lower electrode 55*a* and the variable resistance layer 59 is arranged at least along the tapered face of the opening of the barrier insulation film 57.

A metal film used for formation of the oxidation prevention film 59*a* may be lamination of titanium and aluminum, or a single layer of titanium and aluminum.

The first upper electrode 60 is an electrode located on the lower layer side of the upper electrode of the "two-terminal switch" 72 and in direct contact with the ion conduction layer 59*b*. As the first upper electrode 60, an alloy of ruthenium which is difficult to ionize compared with the metal forming the first wiring 55 and difficult to diffuse and generate ion conduction in the second ion conduction layer 59*b* and titanium, tantalum, aluminum, manganese, zirconium, hafnium, magnesium, cobalt, copper, zinc, etc. which adhere tightly to the metal forming the first wiring 55. It is desirable that content ratio of ruthenium in the ruthenium alloy exceeds 30 atm % and is not more than 95 atm %, and is preferably selected from the range of 50 atm % to 95 atm %. For example, the content ratio of ruthenium may be selected from a range which exceeds 30 atm % and is not more than 80 atm %. Two or more kinds of metals may be added to ruthenium.

In the ruthenium alloy used for forming of the first upper electrode 60, as a metal to be added to ruthenium, it is desirable to select such metal whose standard Gibbs energy of forming of a process in which a metal ion is generated from a metal (oxidation process) is higher in the negative direction than the energy of ruthenium. Since titanium, tantalum, aluminum, manganese, zirconium, hafnium, magnesium, cobalt, copper, and zinc whose standard Gibbs energy of forming of a process in which a metal ion is generated from a metal (oxidation process) is higher in the negative direction than the energy of ruthenium indicate that a chemical reaction is likely to spontaneously occur compared with ruthenium, reactive property is high. In the ruthenium alloy forming the first upper electrode 60, by alloying with ruthenium, adhesion with the metal bridge formed by the metal forming the first wiring 55 is improved. If the first upper electrode 60 is formed by using only the added metals without ruthenium, reactive property is increased and transition to the "OFF" state does not occur. Though the transition from the "ON" state to the "OFF" state proceeds on the basis of an oxidation reaction (dissolution reaction) of the metal bridge, if standard Gibbs energy of forming of a process in which a metal forming the first upper electrode 60 generates a metal ion from the metal (oxidation process) is higher in the negative direction than the energy of the metal forming the first wiring 55, since oxidation reaction of the first upper electrode 60 proceeds in prior to oxidation reaction of the metal bridge formed by using the metal forming the first wiring 55 (e.g. copper), transition to the "OFF" state does not occur. Therefore, a metal material used for forming of the first upper electrode 60 has to be formed by using the alloy with ruthenium whose standard Gibbs energy of forming of a process in which a metal ion is generated from a metal (oxidation process) is lower in the negative direction than the energy of copper.

When copper which is a component of the metal bridge is mixed in the first upper electrode 60 during a process of the transition from the "OFF" state to the "ON" state, ruthenium content ratio in the ruthenium alloy near a boundary face of the first upper electrode 60 which is in contact with the second ion conduction layer 59b is decreased. If ruthenium content ratio near the boundary face of the first upper electrode 60 which is in contact with the second ion conduction layer 59b is excessively decreased, effect that the metal whose standard Gibbs energy of forming is high in the negative direction is added at a proper content ratio is deteriorated. It is preferable that a metal material with the barrier property against copper and copper ion is employed as a metal to be added to ruthenium in order to suppress "excessive decrease of ruthenium content ratio" caused by "copper incorporation" during the process of the transition from the "OFF" state to the "ON" state. As a "metal material with the barrier property against copper and copper ion", tantalum, titanium, manganese, and the like are preferable. The "metal material with the barrier property against copper and copper ion" can be locally added in a region near the boundary face of the first upper electrode 60 which is in contact with the second ion conduction layer 59b. For example, a very thin film of tantalum, titanium, or manganese is formed on the second ion conduction layer 59b, a film of ruthenium alloy is laminated thereon, solid-phase diffusion is carried out between the very thin film of tantalum, titanium, or manganese and the film of ruthenium alloy, thereby tantalum, titanium, or manganese can be locally added in in the region near the boundary face of the first upper electrode 60 which is in contact with the second ion conduction layer 59b. A part of a very thin film of tantalum, titanium, or manganese which is formed on the second ion conduction layer 59b is nitrided to form lamination in which a very thin film of tantalum nitride, titanium nitride, or manganese nitride and a very thin film of tantalum, titanium, or manganese are laminated, the film of the ruthenium alloy is laminated thereon, solid-phase diffusion is carried out, and thereby local addition in the region near the boundary face is possible.

The second upper electrode 61 is an electrode on the upper layer side in the upper electrode of the "two-terminal switch" 72, and is formed on the first upper electrode 60. The second upper electrode 61 has a role of protection for the first upper electrode 60. Since the second upper electrode 61 protects a first upper electrode 100, damage to the first upper electrode 60 in a process is suppressed and a switching property of the "two-terminal switch" 72 can be maintained. Tantalum, titanium, or manganese, or nitride thereof is available for the second upper electrode 61.

The hard mask film 62 is a film which works as a passivation film and a hard mask film when the second upper electrode 61, the first upper electrode 60, and the ion conduction layer 59a, the oxidation prevention film 59b are etched. The silicon nitride film, or the like, is available for the hard mask film 62. The hard mask film 62 is preferably made from the same material as that of the protection insulation film 64 and the barrier insulation film 57. Since the same material is arranged around the "two-terminal switch" 72, material boundary faces becomes integrated, penetration of water from the outside is prevented, and separation from the "two-terminal switch" 72 itself can be prevented.

The protection insulation film 64 is an insulation film having a function in which the "two-terminal switch" 72 has no damage, and separation of oxygen from the ion conduction layer 59b is prevented. Silicon nitride, silicon carbonitride, or the like is available for the protection insulation film 64. The protection insulation film 64 is preferably made from the same material as that of the hard mask film 62 and the barrier insulation film 57. If the same material is used, the protection insulation film 64, the barrier insulation film 57 and the hard mask film 62 becomes integrated, adhesion of the boundary face is improved, and the "two-terminal switch" 72 can be further protected.

The inter-layer insulation film 65 is an insulation film which is formed on the protection insulation film 64. As the inter-layer insulation film 65, for example, a silicon oxide film, a SiOC film, a low permittivity film (e.g. SiOCH film) whose relative permittivity is lower than that of the silicon oxide film, or the like, is available. The inter-layer insulation film 65 may be a film in which a plurality of insulation films are laminated. The inter-layer insulation film 65 may have the same material as that of the inter-layer insulation film 67. The inter-layer insulation film 65 includes the lower hole in which the plug 69 is to be embedded, The plug 69 is embedded, through the barrier metal 70, in the lower hole.

The etching stopper film 66 is an insulation film which is located between the inter-layer insulation films 65 and 67. The etching stopper film 66 has a role of an etching stopper layer during forming of the wiring groove for the second wiring 68. A silicon nitride film, a SiC film, a silicon carbonitride film, or the like is available for the etching stopper film 66. The wiring groove in which the second wiring 68 is embedded is formed in the etching stopper film 66. The second wiring 68 is embedded, through the barrier metal 70, in the wiring groove. The etching stopper film 66 may be removed depending on selection of an etching condition for the wiring groove.

The inter-layer insulation film 67 is an insulation film which is formed on the etching stopper film 66. As the inter-layer insulation film 67, for example, a silicon oxide film, a SiOC film, a low permittivity film (e.g. SiOCH film) whose relative permittivity is lower than that of the silicon oxide film, or the like, is available. The inter-layer insulation film 67 may be a film in which a plurality of insulation films are laminated. The inter-layer insulation film 67 may have the same material as that of the inter-insulation film 15. The inter-layer insulation film 67 includes a wiring groove in which the second wiring 68 is embedded, The second wiring 68 is embedded, through the barrier metal 70, in the wiring groove. The second wiring 68 is wiring which is embedded, through the barrier metal 70, in a wiring groove which is formed in the inter-layer insulation film 67 and the etching stopper film 66. The second wiring 68 is integrated in the plug 69. The plug 69 is embedded, through the barrier metal 70, in the hole which is formed in the inter-layer insulation film 65, the protection insulation film 64, and the hard mask film 62. The plug 69 is electrically connected to the second upper electrode 61 through the barrier metal 70. Copper is available for the second wiring 68 and the plug 69.

The barrier metal 70 is a conductive film with a barrier property which coats side faces and bottom faces of the second wiring 68 and the plug 69 in order to prevent the metal forming the second wiring 68 (including plug 69) from diffusing to the inter-layer insulation films 65 and 67 or a lower layer. If a second wiring 108 and the plug 69 are made from metal elements including copper as a primary component, a refractory metal, nitride thereof, or the like, such as tantalum, tantalum nitride, titanium nitride, tungsten carbonitride, and a lamination film thereof, are available for the barrier metal 50. The barrier metal 70 is preferably made from the same material as that of the second upper electrode 61. For example, if the barrier metal 70 has a lamination structure including tantalum nitride (lower layer)/tantalum (upper layer), it is preferable that tantalum nitride as a lower layer material is used for the second upper electrode 61.

The barrier insulation film 71 is an insulation film which is formed on the inter-layer insulation film 67 including the second wiring 68, and prevents oxidation of the metal forming the second wiring 68 (e.g. copper) and prevents the metal forming the second wiring 68 from diffusing into an upper layer. Silicon carbonitride, silicon nitride, a laminated structure thereof, or the like, are available for the barrier insulation film 71.

Embodiment 3

Figure 6:
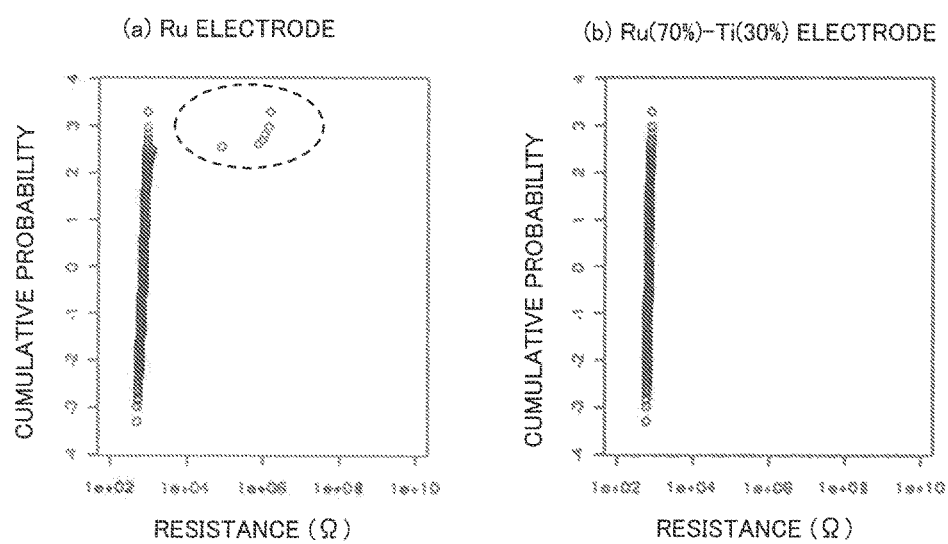
FIG. 6 is a graph illustrating a switching property of the switching element employing the structure of the "two-terminal switch" and a holding property of a resistance value in a "ON" state, in the first exemplary embodiment.

Operations of the "two-terminal switch" type switching element described in the Embodiment 2 are explained according to FIG. 6.

FIG. 6 is a diagram illustrating normal distributions of electrical current values of just after transition to the "ON" state and 100 hours after transition thereto regarding all elements in a 2 kilobits array of the "two-terminal switch" type switching element formed in the multi-layered wiring. In the transition to the "ON" state, a positive voltage is applied to the first lower electrode 55a in FIG. 5. FIG. 6(a) illustrates a result of the elements in which the first upper electrode 60 of FIG. 5 is manufactured by using only ruthenium, and the elements of about 6 bits become highly-resistive 100 hours after. FIG. 6(b) illustrates a result of the elements in which the first upper electrode 60 of FIG. 5 is manufactured by using "alloy of ruthenium and titanium", and no element becomes highly-resistive 100 hours after. It is known that the "alloy of ruthenium and titanium" which forms the first upper electrode 60 of the element used in FIG. 6(b) has the composition of 70 atm % ruthenium and 30 atm % titanium, by X-ray photoelectron spectroscopy.

Figure 7:
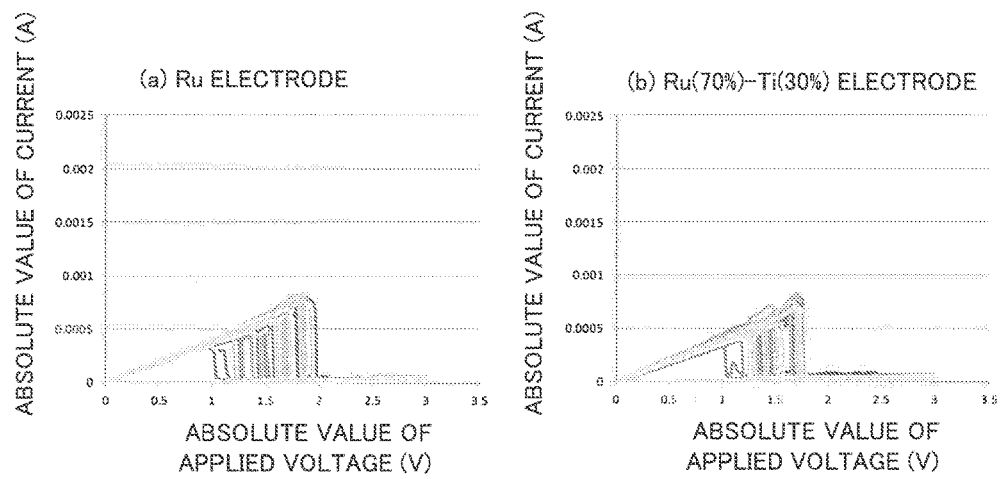
FIG. 7 is a graph illustrating a switching property of the switching element employing the structure of the "two-terminal switch" and distribution of an electrical current value required for switching to the "OFF" state, in the first exemplary embodiment.
Figure 8D:
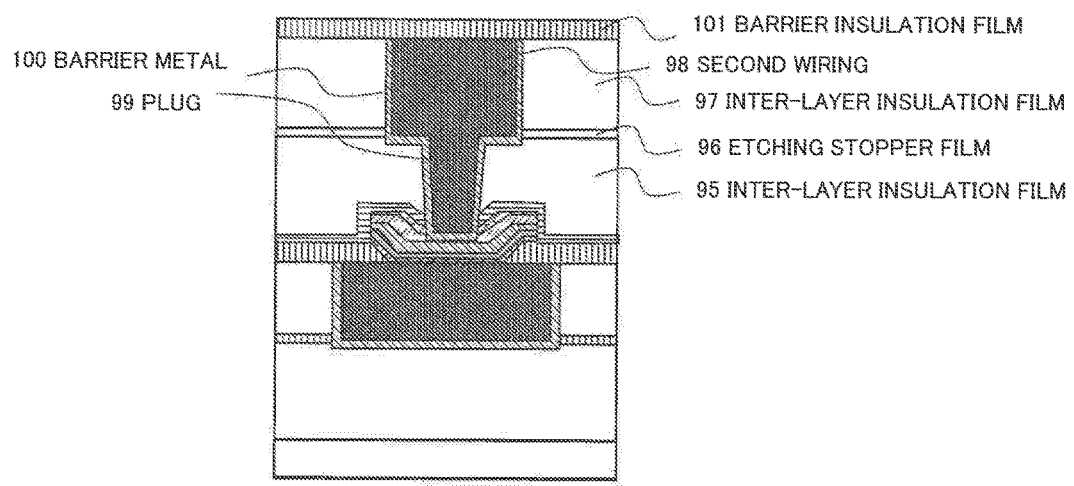
FIG. 8D is a cross sectional view schematically illustrating a step 12 in the manufacturing process of the semiconductor device including the "two-terminal switch" formed in the multi-layered wiring layer in the first exemplary embodiment.
Figure 10D:
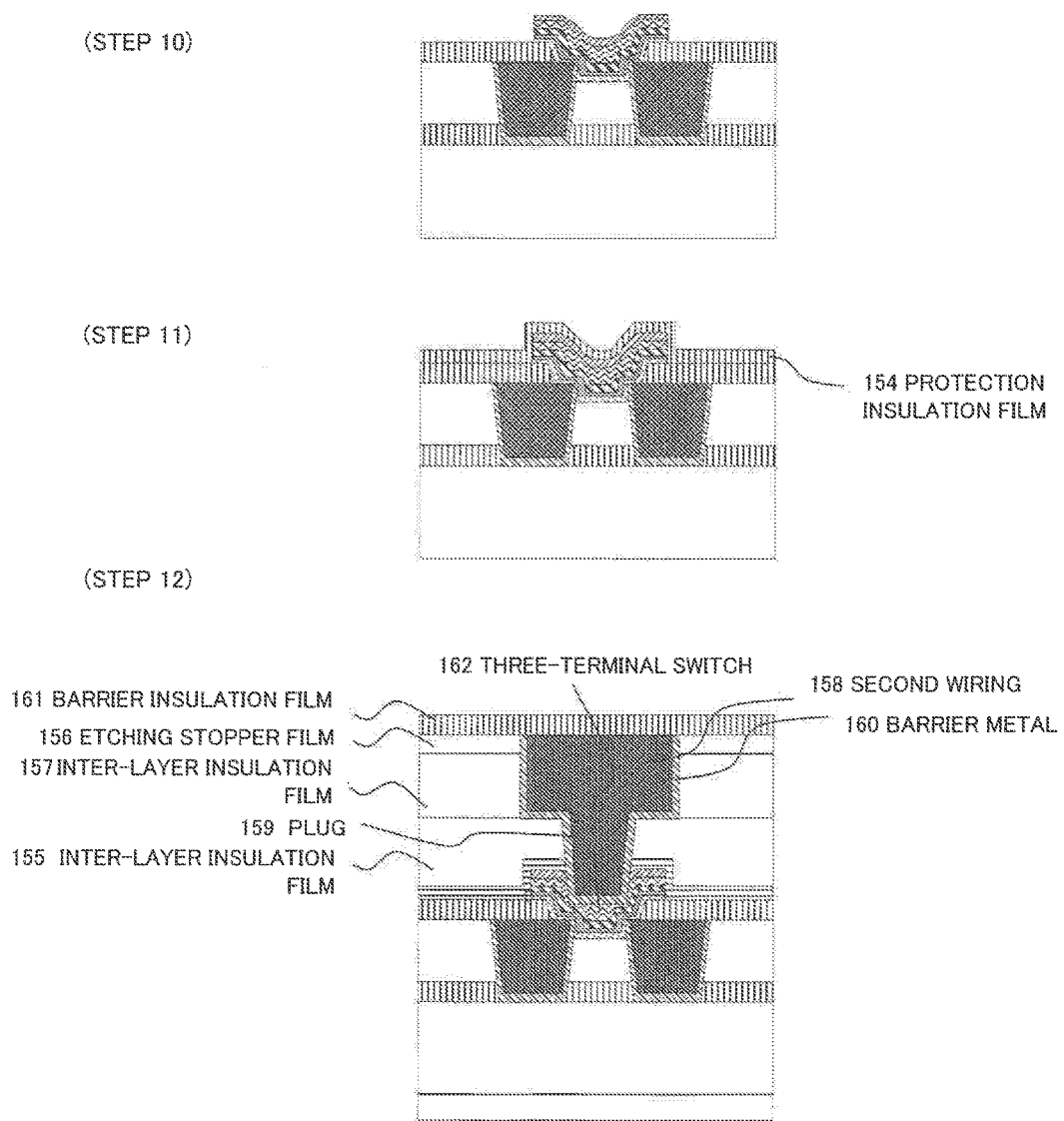
FIG. 10D is a cross sectional view schematically illustrating a step 10 to a step 12 in the manufacturing process of the semiconductor device including the "three-terminal switch" formed in the multi-layered wiring layer in the second exemplary embodiment.

FIG. 7 illustrates current-voltage characteristics in the transition from the "ON" state to the "OFF" state on a switching element with the structure of the "two-terminal switch" which is formed in the multi-layered wiring. In the transition from the "ON" state to the "OFF" state, a negative voltage is applied to the first lower electrode 55a in FIG. 5. At this time, an observed current is a negative current. In FIG. 7, both the current and the voltage are indicated by absolute values. FIG. 7(a) shows the result of the element which is formed by using the first upper electrode 60 of FIG. 5 made from only ruthenium and FIG. 7(b) shows the result of the element which is formed by using the first upper electrode 60 of FIG. 5 made from the alloy of ruthenium and titanium. It is known that the "alloy of ruthenium and titanium" which forms the first upper electrode 60 of the element used in FIG. 7(b) has the composition of 70 atm % ruthenium and 30 atm % titanium, by X-ray photoelectron spectroscopy. In FIG. 7(a) and FIG. 7(b), resistance values after the transition to the "ON" state are similar to each other. In both FIG. 7(a) and FIG. 7(b), though the absolute value of the largest current is a required current at the time of the transition from the "ON" state to the "OFF" state, both currents approximately accord with each other in FIG. 7(a) and FIG. 7(b). From this, even though the upper electrode made from the "alloy of ruthenium and titanium" is used, a current which transfers from the "ON" state to the "OFF" state is not increased. The "alloy of ruthenium and titanium" has high resistivity compared with ruthenium. It is therefore understood that the upper electrode is easy to get hot due to the current at the time of the transition from the "ON" state to the "OFF" state. In order to progress the reaction in which the metal bridge formed in the ion conduction layer 59b dissolves due to application of a voltage, contribution of Joule heat which is generated in the metal bridge is required. The effect of confinement of Joule heat which is generated in the metal bridge by manufacturing the first upper electrode 60 using the ruthenium alloy, for example, the "alloy of ruthenium and titanium" and by heating the first upper electrode 60 by a current at the time of the transition from the "ON" state to the "OFF" state causes a current which transfers from the "ON" state to the "OFF" state not to be increased and keeps the holding ability high.

Performance similar to the property of holding ability and the electrical property of the switching element in which the first upper electrode 60 is made from the "alloy of ruthenium and titanium (ruthenium 70 atm %, titanium 30 atm %)", in FIG. 6(b) and FIG. 7(b), is observed when an alloy of ruthenium and tantalum (50 atm %:50 atm %) is used, and when an alloy of ruthenium and manganese (95 atm %:5 atm %) is used.

If the first upper electrode 60 is made from only a metal, which does not include ruthenium, whose standard Gibbs energy of forming of a process in which a metal ion is generated from a metal (oxidation process) is low, when a negative voltage is applied to the first lower electrode 55 at the time of the transition from "ON" state to the "OFF" state, insulation breakdown of the ion conduction layer 59b occurs and transition to the "OFF" state does not occur. If content ratio of ruthenium is not more than 30 atm %, when a negative voltage is applied to the first lower electrode 55 at the time of the transition from "ON" state to the "OFF" state, insulation breakdown of the ion conduction layer 59b is observed and the transition to the "OFF" state does not occur.

It is observed that when ruthenium and titanium (30 atm %:70 atm %) and ruthenium and tantalum (30 atm %:70 atm %) are used, the transition to the "OFF" state does not occur.

Embodiment 4

A manufacturing process of a semiconductor device in which a switching element using a structure of the "two-terminal switch" is formed in a multi-layered wiring layer described in the embodiment 2, in particular a step of forming the switching element using the structure of the "two-terminal switch" in the multi-layered wiring layer is explained by using drawings. FIG. 8A to FIG. 8D are cross-sectional views schematically illustrating steps 1 to 12 of a manufacturing process of the semiconductor device described in the embodiment 2 which uses the switching element using the structure of the "two-terminal switch" of the first exemplary embodiment.

(Step 1)

An inter-layer insulation film 82 (e.g. silicon oxide film, 300 nm in thickness) is deposited on a semiconductor substrate 81 (e.g. substrate on which a semiconductor element is formed), after that a barrier insulation film 83 (e.g. silicon nitride film, 50 nm in thickness) is deposited on the inter-layer insulation film 82, after that an inter-layer insulation film 84 (e.g. silicon oxide film, 300 nm in thickness) is deposited on the barrier insulation film 83, after that a wiring groove is formed in the inter-layer insulation film 84 and the barrier insulation film 83 using a lithography method (including photoresist forming, dry etching, and photoresist removing), after that through a barrier metal 86 (e.g. tantalum nitride/tantalum, 5 nm/5 nm in thickness), a first wiring 85 (e.g. copper) is embedded in the wiring groove. The inter-layer insulation films 82 and 84 can be formed by the plasma CVD method. The first wiring 85 can be formed, for example, by forming the barrier metal 86 (e.g. lamination film of tantalum nitride/tantalum) by the PVD method, embedding copper in the wiring groove by an electrolytic plating method after forming a copper seed by the PVD method, and removing excess copper outside the wiring groove by the CMP method after heat treatment at the temperature of 200° C. or more. Such a series of methods for forming copper wiring can use a general technique in the technical field. The CMP (Chemical Mechanical Polishing) method is a method for flattening irregularities of a wafer surface, which may occur during a multi-layer wiring forming process, by polishing by bringing into contact with a rotating polishing pad while flowing polishing solution on the wafer surface. Embedded wiring (damascene interconnect) is formed by polishing excess copper embedded in a groove, and flattening is carried out by polishing an inter-layer insulation film.

(Step 2)

A barrier insulation film 87 (e.g. silicon nitride film or silicon carbonitride film, 50 nm in thick) is formed on the inter-layer insulation film 84 including the first wiring 85. The barrier insulation film 87 can be formed by the plasma CVD method. The thickness of the barrier insulation film 87 is preferably in the order of 10 nm to 50 nm.

(Step 3)

A hard mask film 88 (e.g. silicon oxide film) is formed on the barrier insulation film 87. In the light of keeping etching selectivity high in dry etching processing, the hard mask film 88 is preferably a different material from the barrier insulation film 87, and may be an insulation film or a conductive film. As the hard mask film 88, for example, a silicon oxide film, a silicon nitride film, titanium nitride, titanium, tantalum, or tantalum nitride is available, and a lamination body of silicon nitride/silicon oxide is available.

(Step 4)

An opening is patterned on the hard mask film 88 using photoresist (not shown), an opening pattern is formed in the hard mask film 88 by carrying out dry etching using the photoresist as a mask, after that the photo resist is removed by using oxygen plasma ashing, or the like. At this time, the dry etching is not necessarily required to stop at an upper face of the barrier insulation film 87, and may reach the inside of the barrier insulation film 87.

(Step 5)

An opening is formed in the barrier insulation film 87 by etching back (dry etching), by using the hard mask film 88 as a mask, the barrier insulation film 87 which is exposed at the opening of the hard mask film 88, the first wiring 85 is exposed at the opening of the barrier insulation film 87, after that copper oxide formed on an exposed face of the first wiring 85 is removed by carrying out an organic separating treatment with amine-based separating solution, and an etching by-product which is generated during etch back is removed. In the etch back of the barrier insulation film 87, a wall face of the opening of the barrier insulation film 87 can be formed to be a tapered face by using reactive dry etching. In the reactive dry etching, gas including fluorocarbon is available as etching gas. It is preferable that the hard mask film 88 is completely removed during etch back, and may be left if the film 88 is an insulation material. A shape of the opening of the barrier insulation film 87 may be a circle shape and may be 30 nm to 500 nm in diameter of the circle shape. An oxide on the surface of the first wiring 85 is removed by RF (Radio Frequency) etching using non-reactive gas. As the non-reactive gas, helium or argon is available.

(Step 6)

0.5 nm titanium and 0.5 nm aluminum are deposited in this order on the barrier insulation film 87 including the first lower electrode 85 to be 1 nm in total. Titanium and aluminum can be formed by using the PVD method or the CVD method. As an ion conduction layer 89b, a SIOCH-based polymer film including oxygen, carbon, and hydrogen is formed using plasma CVD. Raw materials of cyclic organosiloxane and helium as a carrier gas are introduced into a reaction chamber, and application of RF power is started when supply of the two is stabilized and a pressure in the reaction chamber becomes constant. Supplied amount of the raw materials is 10 to 200 sccm, supply of helium through a raw material carburetor is 500 sccm, and 500 sccm helium is directly supplied into the reaction chamber using a different line. Titanium and aluminum are exposed by raw materials of the SIOCH-based polymer film including oxygen during forming of the ion conduction layer 89b and are spontaneously oxidized to be an oxide, which is an oxidation prevention film 89a which is a part of a variable resistance layer 89. Since water or the like may be adhered to the opening of the barrier insulation film 87 due to the organic separating treatment, outgassing with heat treatment is preferably carried out under reduced pressure at the temperature of 250° C. to 350° C. before deposition of the variable resistance layer 89.

(Step 7)

An "alloy of ruthenium and titanium" of 10 nm in thickness, as a first upper electrode 90, is formed on the variable resistance layer 89 by using the co-sputtering method. At this time a ruthenium target and a titanium target are placed in the same chamber, and an alloy film is deposited by concurrently carrying out sputtering. When power applied to the ruthenium target is 150 W, and power applied to the titanium target is 50 W, content ratio of ruthenium in the "alloy of ruthenium and titanium" becomes 70 atm %. A second upper electrode 91 (e.g. tantalum, 50 nm in thickness) is formed on the first upper electrode 90.

(Step 8)

A hard mask film 92 (e.g. silicon nitride film or silicon carbonitride film, 30 nm in thickness) and a hard mask film 93 (e.g. silicon oxide film, 90 nm in thickness) are laminated in this order on the second upper electrode 91. The hard mask film 92 and the hard mask film 93 can be formed using the plasma CVD method. The hard mask films 92 and 93 can be formed using a general plasma CVD method in this technical field. The hard mask film 92 and the hard mask film 93 are preferably different kinds of films, for example, the hard mask film 92 may be a silicon nitride film, and the hard mask film 93 may be a $SiO_2$ film. In this case, the hard mask film 92 is preferably made from the same material as those of a protection insulation film 94 and the barrier insulation film 87. It becomes possible that a surrounding of a variable resistance element is made from the same material, a boundary face is integrated, entry of water from the outside is prevented, and separation from the variable resistance element itself is prevented. Although the hard mask film 92 can be formed by the plasma CVD method, for example, it is preferable to use a high density silicon nitride film or the like by high density plasma using mixture gas of $SiH_4/N_4$.

(Step 9)

Photoresist (not shown) is formed in order to pattern the "two-terminal switch" unit on the hard mask film 93, after that the hard mask film 93 is dry-etched using the photo resist as a mask until the hard mask film 92 appears, after that the photo resist is removed by using oxygen plasma ashing and organic separating.

(Step 10)

By using the hard mask film 93 as a mask, the hard mask film 92, the second upper electrode 91, the first upper electrode 90, and the ion conduction layer 89 are continuously dry-etched. At this time, it is preferable that the hard mask film 93 is completely removed during etch back, however the film 93 may remain. For example, if the second upper electrode 91 is made from tantalum, forming by RIE of $Cl_2$-based is possible, and if the first upper electrode 90 is made from the "alloy of ruthenium and titanium", RIE forming by using mixture gas of $Cl_2/O_2$ is possible. In etching of an ion conduction layer 99, dry etching has to be stopped on the barrier insulation film 87 of the lower face. If the ion conduction layer 89 is the SIOCH-based polymer film including oxygen, carbon, and hydrogen, and the barrier insulation film 87 is a silicon nitride film or a silicon carbonitride film, RIE forming is possible by adjusting an etching condition by using a mixture gas such as $CF_4$-based, $CF_4/Cl_2$-based, $CF_4/Cl_2/Ar$-based, or the like. By using the hard mask RIE method, without exposing a variable resistance element unit to the oxygen plasma ashing for resist removal, the variable resistance element unit can be formed. If an oxidation treatment is carried out by oxygen plasma after the forming, it is possible to irradiate the oxidation plasma treatment without depending on resist separating time.

(Step 11)

The protection insulation film 94 (e.g. silicon nitride or silicon carbonitride film, 30 nm) is deposited on the barrier insulation film 87 including the hard mask film 92, the second upper electrode 91, the first upper electrode 90, and the ion conduction layer 89. Though the protection insulation film 94 can be formed by the plasma CVD method, since the reaction chamber is required to be kept at reduced pressure before deposition, a problem may arise such that oxygen is separated from a side face of the variable resistance layer 89, and a leak current of the ion conduction layer is increased. In order to suppress them, a temperature for forming the protection insulation film 94 is preferably not more than 250° C. Since the film 94 is exposed in film forming gas under reduced pressure before the deposition, reductive gas is preferably not used. For example, a silicon nitride film is preferably used, which is formed from $SiH_4/N_2$ mixture gas by using high density plasma, at the substrate temperature of 200° C.

(Step 12)

An inter-layer insulation film 95 (e.g. silicon oxide film), an etching stopper film 96 (e.g. silicon nitride film), and an inter-layer insulation film 97 (e.g. silicon oxide film) are deposited in this order on the protection insulation film 94, after that a wiring groove for a second wiring 98 and a lower hole for a plug 99 are formed, the second wiring 98 (e.g. copper) and the plug 99 (e.g. copper) are concurrently formed in the wiring groove and the lower hole through a barrier metal 100 (e.g. tantalum nitride/tantalum) using a copper dual damascene wiring process, after that a barrier insulation film 101 (e.g. silicon nitride film) is deposited on the inter-layer insulation film 97 including the second wiring 98. In order to form the second wiring 98, the same process as that of lower layer wiring formation can be used. At this time, when the barrier metal 100 and the second upper electrode 91 is made from the same material, contact resistance between the plug 99 and the second upper electrode 91 can be reduced, and element performance can be improved. The inter-layer insulation film 95 and the inter-layer insulation film 97 can be formed by the plasma CVD method. In order to eliminate a difference in level formed by the "two-terminal switch" 82, the inter-layer insulation film 95 may be thickly formed, the inter-layer insulation film 95 may be shaved and flattened by CMP, the inter-layer insulation film 95 may have a desired thickness.

Second Exemplary Embodiment

A semiconductor device in which a "three-terminal switch" in which upper electrodes are electrically connected each other is formed in a multi-layered wiring layer related to a second exemplary embodiment is explained by using FIG. 9.

A semiconductor device having a variable resistance element in a multi-layered wiring has a structure in which a variable resistance 119 is located between a upper electrode 120 and a first wiring 115, the multi-layered wiring layer includes two different first wirings (115a, 115b) and a plug 129 electrically connecting to a first upper electrode 121 and a second upper electrode 122, the first wiring 115 (115a. 115b) also works as a lower electrode, the variable resistance layer 119 is connected to the first wirings 115 (115a, 115b) made from two separate coppers through one opening, the opening reaches an inside of an inter-layer insulation film 114 of the first wiring 115. A method for forming a multi-layered wiring structure of FIG. 9 is the same as the method for forming the multi-layered wiring structure (FIG. 5) in the first exemplary embodiment.

The multi-layered wiring layer includes an insulation lamination body in which an inter-layer insulation film 112, a barrier insulation film 113, the inter-layer insulation film 114, a barrier insulation film 117, a protection insulation film 124, an inter-layer insulation film 125, an etching stopper film 126, an inter-layer insulation film 127, and a barrier insulation film 131 are laminated in this order on a semiconductor substrate 111. In the multi-layered wiring layer, the first wiring 115 is embedded, through a barrier metal 116, in a wiring groove which is formed in the inter-layer insulation film 114 and the barrier insulation film 113. In the multi-layered wiring layer, a second wiring 128 is embedded in a wiring groove which is formed in the inter-layer insulation film 127 and the etching stopper film 126, the plug 129 is embedded in a lower hole which are formed in the inter-layer insulation film 125, the protection insulation film 124, and a hard mask film 122, and the second wiring 128 and the plug 129 are integrated each other, and side faces and bottom faces of the second wiring and the plug 129 are coated by a barrier metal 130. In the multi-layered wiring layer, in an opening formed in the barrier insulation film 117, a "three-terminal switch" 132 in which a variable resistance layer 11a, the first upper electrode 120, and the second upper electrode 121 are laminated in this order on a first wiring A 115a and a first wiring B 115b as a lower electrode, a wall face of the opening of the barrier insulation film 117, and the barrier insulation film 117 is formed, and the hard mask film 122 is formed on the second upper electrode 121, and an upper face and a side face of a lamination body including the variable resistance element layer 119, the first upper electrode 120, the second upper electrode 121, and the hard mask film 122 are coated by the protection insulation film 124. When the first wiring A 115a and the first wiring B 115b are used as lower electrodes of the "three-terminal switch" 132, that is, when the first wiring A 115a and the first wiring B 115b also work as the lower electrodes of the "three-terminal switch" 132, electrical resistance can be reduced while simplifying the number of steps. Only by forming at least a 2PR mask set, as a step to be added to a common copper damascene wiring process, a variable resistance element can be mounted and low resistance and low cost of the element are concurrently achieved.

The "three-terminal switch" 132 is a variable resistance type non-volatile switching element, for example, can be used as a switching element using metal ion migration and an electrochemical reaction in an ion conductive body. The "three-terminal switch" (variable resistance element) 132 has a structure in which the variable resistance layer 119 is located between the first wiring A 115a and the first wiring B 115b serving as lower electrodes and the upper electrodes 120 and 121 electrically connecting to the plug 129. In the "three-terminal switch" 132, the variable resistance layer 119, and the first wiring A 115a and the first wiring B 115b are in direct contact with each other in a region of an opening formed in the barrier insulation film 117, the plug 129 and the second upper electrode 121 are electrically connected each other through the barrier metal 130 on the second upper electrode 121. The variable resistance element 22 carries out on/off control on the basis of voltage application and current flowing, for example, carries out on/off control by using electrical field diffusion to the variable resistance layer 119 of a metal ion generated in a metal which forms the first wiring A 115a and the first wiring B 115b. The second upper electrode 121 and the barrier metal 20 are made from the same material. Thereby, the barrier metal 130 of the plug 129 and the second upper electrode 11 of the variable resistance element 22 are integrated, contact resistance is reduced, and reliability improvement caused by adhesion improvement can be achieved.

The semiconductor substrate 111 is a substrate on which a semiconductor element is formed. As the semiconductor substrate 111, for example, a silicon substrate, a single crystal substrate, a SOI (Silicon on Insulator) substrate, a TFT (Thin Film Transistor) substrate, a substrate for liquid crystal manufacturing, or the like, is available.

The inter-layer insulation film 112 is an insulation film which is formed on the semiconductor substrate 1. As the inter-layer insulation film 112, for example, a silicon oxide film, a low permittivity film (e.g. SiOCH film) whose relative permittivity is lower than permittivity of the silicon oxide film, or the like, is available. The inter-layer insulation film 112 may be lamination of a plurality of insulation films.

The barrier insulation film 113 is an insulation film with a barrier property which is located between the inter-layer insulation films 112 and 114. The barrier insulation film 113 has a role of an etching stop layer while a wiring groove for the first wiring 115 is formed. A silicon nitride film, a silicon carbonitride film, or the like is available for the barrier insulation film 113. The wiring groove for embedding the first wiring 115 is formed in the barrier insulation film 113, and the first wiring 5 is embedded in the wiring groove through the barrier metal 6. The barrier insulation film 113 may be removed depending on selection of an etching condition for the wiring groove.

The inter-layer insulation film 114 is an insulation film which is formed on the barrier insulation film 113. As the inter-layer insulation film 114, for example, a silicon oxide film, a low permittivity film (e.g. SiOCH film) whose relative permittivity is lower than permittivity of the silicon oxide film, or the like, is available. The inter-layer insulation film 4 may be a film in which a plurality of insulation films are laminated. The wiring groove for embedding the first wiring 115 is formed in the barrier insulation film 114, and the first wiring 115 is embedded in the wiring groove through the barrier metal 116.

The first wiring 115 is wiring which is embedded, through the barrier metal 116, in the wiring groove which is formed in the inter-layer insulation film 114 and the barrier insulation film 113. The first wiring 115 also works as a lower electrode of the "three-terminal switch" 132 and is in direct contact with the variable resistance layer 119. An electrode layer may be placed between the first wiring 115 and the variable resistance layer 119. If the electrode layer is formed, the electrode layer and the variable resistance layer 119 are deposited by continuous steps and formed by continuous steps. A lower part of the variable resistance layer 119 does not come in contact with the lower wiring through a contact plug. In order to form the first wiring 115, a metal which generates a metal ion which can diffuse and be ion conductive in the variable resistance layer 119 is used, for example, copper, etc. is available. The metal forming the first wiring 115 (e.g. copper) may be alloyed with Al.

The barrier metal 116 is a conductive film with a barrier property which coats a side face and a bottom face of the wiring in order to prevent the metal forming the first wiring 115 (e.g. copper) from diffusing into the inter-layer insulation film 4 or a lower layer. As a barrier metal 116, if the first wiring 5 is made from a metal element including copper as a primary component, refractory metal or nitride thereof such as tantalum, tantalum nitride, titanium nitride, or tungsten carbonitride, or a lamination film thereof can be used.

The barrier insulation film 117 is formed on the inter-layer insulation film 114 including the first wiring 115, prevents oxidation of the metal forming the first wiring 115 (e.g. copper), prevents diffusion of the metal forming the first wiring 115 into the inter-layer insulation film 125, and has a role of an etching stop layer while the upper electrodes 121 and 120, and the variable resistance layer 119a are formed. As the barrier insulation film 117, for example, a SiC film, silicon carbonitride film, a silicon nitride film, a lamination structure thereof, or the like, is available. The barrier insulation film 117 is preferably made from the same material as that of the protection insulation film 124 and the hard mask film 122.

The barrier insulation film 117 includes an opening on the first wiring 115. The first wiring 115 is in contact with the variable resistance layer 119 at the opening of the barrier insulation layer 117. The opening of the barrier insulation layer 117 is formed within a region of the first wiring 115. Thereby the "three-terminal switch" 132 can be formed on an even surface of the first wiring 115. A wall face of the opening of the barrier insulation layer 117 is a tapered face which is widened as the face gets away from the first wiring 115. The tapered face of the opening of the barrier insulation film 117 is set 85° or less with respect to an upper face of the first wiring 115. Thereby electrical field concentration in outer periphery of a contact part between the first wiring 115 and the variable resistance layer 119 (outer periphery of the opening of the barrier insulation layer 117) is eased, and an insulation resistance can be improved.

The variable resistance layer 119 is a film whose resistance is variable, and made from an ion conduction layer 119b and an oxidation prevention film 119a. The ion conduction layer 119b can use a material whose resistance is variable due to actions (diffusion, ion conduction, etc.) of a metal ion generated from the metal forming the first wiring 115 (lower electrode). When resistance variation of the "three-terminal switch" 132 with switching to the "ON" state is carried out using metal deposition caused by metal ion reduction, an ion conductible film is employed, and, for example, a SIOCH-based polymer film including silicon, oxygen, carbon and hydrogen, is used.

The oxidation prevention film 119a has a role to prevent the metal forming the first wiring 115 (e.g. copper) from diffusing into the ion conduction layer 119b due to heating and plasma during deposition of the ion conduction layer 119b, and to prevent the first wiring 115 from being oxidized and from tending to diffuse. The metal of the oxidation prevention film 119a, for example, zirconium, hafnium, titanium, aluminum, is oxidized during forming of the ion conduction layer 119b to be zirconium oxide, hafnium oxide, titanium oxide, aluminum oxide, and to become a part of the variable resistance layer 119b. The optimum thickness of the metal of the oxidation prevention film 119a is 0.5 nm to 1 nm, and if the metal is thinner, copper wiring surface is slightly oxidized, and if the metal is thicker, the metal slightly remains without being oxidized. The variable resistance layer 119 is formed on the first wiring 115, the tapered face of the opening of the barrier insulation film 117, and the barrier insulation film 117. In the variable resistance layer 119, an outer periphery part of the connection part between the first wiring 55 and the variable resistance layer 119 is arranged at least along the tapered face of the opening of the barrier insulation film 117. The oxidation prevention film 119a may be lamination or mixture of zirconium, hafnium, titanium, and aluminum.

The first upper electrode 120 is an electrode located on the lower side of the upper electrode of the "three-terminal switch" 132, and is in direct contact with the ion conduction layer 119b. As the first upper electrode 120, an alloy including ruthenium which is difficult to ionize compared with the metal forming the first wiring 115 and difficult to diffuse and generate ion conduction in the ion conduction layer 119b, and titanium, tantalum, aluminum, manganese, zirconium, hafnium, magnesium, cobalt, copper, zinc, etc. which adhere tightly to the metal forming the first wiring A 115a and the first wiring B 115b is used. It is desirable that content ratio of ruthenium in the ruthenium alloy is selected from the range more than 30 atm % and not more than 95 atm %, and is preferably selected from the range from 50 atm % to 95 atm %. Two or more kinds of metals may be added to ruthenium.

In the ruthenium alloy used for forming the first upper electrode 120, it is desirable to select, as a metal to be added to ruthenium, such metal whose standard Gibbs energy of forming of a process in which a metal ion is generated from a metal (oxidation process) is higher in the negative direction than the energy of ruthenium. Titanium, tantalum, aluminum, manganese, zirconium, hafnium, magnesium, cobalt, copper, and zinc whose standard Gibbs energy of forming of a process in which a metal ion is generated from a metal (oxidation process) is higher in the negative direction than the energy of ruthenium are likely to spontaneously generate a chemical reaction compared with ruthenium. In the ruthenium alloy used for forming the first upper electrode 120, by alloying with ruthenium, adhesion with the metal bridge formed by the metal forming the first wiring A 115a and the first wiring B 115b is improved. If the first upper electrode 120 is formed by using only the added metal, the electrode has a feature such that standard Gibbs energy of forming of a process in which a metal ion is generated from a metal (oxidation process) is higher in the negative direction than the energy of the metal forming the first wiring A 115a and the first wiring B 115b, or is the same as the energy thereof. The transition from the "ON" state to the "OFF" state proceeds on the basis of an oxidation reaction (dissolution reaction) of the metal forming the metal bridge. In the ruthenium alloy forming the first upper electrode 120, if standard Gibbs energy of forming of a process in which a metal ion is generated from the metal (oxidation process) is higher in the negative direction than the energy of the metal forming the first wiring A 115a and the first wiring B 115b, since oxidation reaction of the first upper electrode 60 proceeds in prior to oxidation reaction of the metal bridge formed by using the metal forming the first wiring A 115a and the first wiring B 115b, thereby the transition to the "OFF" state does not occur. Therefore, a metal material used for forming of the first upper electrode 120 has to be formed using the alloy with ruthenium whose standard Gibbs energy of forming of a process in which a metal ion is generated from the metal (oxidation process) is lower in the negative direction than the energy of copper.

When copper which is a component of the metal bridge is mixed in the first upper electrode 120 during a process of the transition from the "OFF" state to the "ON" state, ruthenium content ratio in the ruthenium alloy near a boundary face of the first upper electrode 60 which is in contact with the second ion conduction layer 59b is decreased. If ruthenium content ratio near the boundary face of the first upper electrode 60 which is in contact with the second ion conduction layer 59b is excessively decreased, effect that the metal whose standard Gibbs energy of forming is high in the negative direction is added at a proper content ratio is deteriorated. It is preferable that a metal material with a barrier property against copper and a copper ion is employed as a metal to be added to ruthenium in order to suppress "excessive decrease of ruthenium content ratio" caused by "copper incorporation" during the process of the transition from the "OFF" state to the "ON" state. As a "metal material with a barrier property against copper and a copper ion", tantalum, titanium, manganese, and the like are preferable. The "metal material with a barrier property against copper and a copper ion" can be locally added in a region near the boundary face of the first upper electrode 60 which is in contact with the second ion conduction layer 59*b*. For example, a very thin film of tantalum, titanium, or manganese is formed on the second ion conduction layer 59*b*, a film of ruthenium alloy is laminated thereon, solid-phase diffusion is carried out between the very thin film of tantalum, titanium, or manganese and the film of ruthenium alloy, tantalum, titanium, or manganese can be locally added in the region near the boundary face of the first upper electrode 60 which is in contact with the second ion conduction layer 59*b*. A part of the very thin film of tantalum, titanium, or manganese which is formed on the second ion conduction layer 59*b* is nitrided to form lamination in which a very thin film of tantalum nitride, titanium nitride, or manganese nitride and the very thin film of tantalum, titanium, or manganese are laminated, the film of the ruthenium alloy is laminated thereon, solid-phase diffusion is carried out, and local addition in the region near the boundary face is possible.

The second upper electrode 121 is an electrode on the upper layer side in the upper electrode of the "three-terminal switch" 132, and is formed on the first upper electrode 120. The second upper electrode 121 has a role of protection for the first upper electrode 120. Since the second upper electrode 121 protects the first upper electrode 120, damage to the first upper electrode 120 in a process is suppressed and a switching property of the "three-terminal switch" 132 can be maintained. Tantalum, titanium, or manganese, or nitride thereof is available for the second upper electrode 121. The second upper electrode 121 is preferably the same material as that of the barrier metal 130. The second upper electrode 121 is electrically connected to the plug 129 through the barrier metal 130. The diameter (or area) of the region where the second upper electrode 121 is in contact with the plug 129 (strictly, the barrier metal 130) is configured to be smaller than the diameter (or area) of the region where the first wiring 115 is in contact with the variable resistance layer 119. Thereby an embedding failure of plating (e.g. copper plating) in the lower hole formed in the inter-layer insulation film 125 which is the connection part of the second upper electrode 121 and the plug 129, is suppressed and generation of voids is suppressed.

The hard mask film 122 is a film which works as a hard mask when the second upper electrode 121, the first upper electrode 120, and the variable resistance layer 119 are etched. A silicon nitride film, a silicon carbonitride film, or the like, is available for the hard mask film 122. The hard mask film 122 is preferably the same material as that of the protection insulation film 124 and the barrier insulation film 117. Since the same material is arranged around the "three-terminal switch" 132, material boundary faces becomes integrated, penetration of water from the outside is prevented, and separation from the "three-terminal switch" 72 itself can be prevented.

The protection insulation film 124 is an insulation film having a function in which the "three-terminal switch" 132 has no damage, and separation of oxygen from the variable resistance layer 119 is prevented. A silicon nitride film, a silicon carbonitride film, or the like is available for the protection insulation film 124. The protection insulation film 124 is preferably the same material as that of the hard mask film 122 and the barrier insulation film 117. If the same material is used, the protection insulation film 124, the barrier insulation film 117 and the hard mask film 112 becomes integrated, adhesion of the boundary face is improved, and the "three-terminal switch" 132 can be further protected.

The inter-layer insulation film 125 is an insulation film which is formed on the protection insulation film 124. As the inter-layer insulation film 125, for example, a silicon oxide film, a SiOC film, a low permittivity film (e.g. SiOCH film) whose relative permittivity is lower than permittivity of a silicon oxide film, or the like, is available. The inter-layer insulation film 125 may be a film in which a plurality of insulation films are laminated. The inter-layer insulation film 125 may have the same material as that of the inter-insulation film 127. The inter-layer insulation film 125 includes the lower hole in which the plug 129 is embedded. The plug 129 is embedded, through the barrier metal 130, in the hole.

The etching stopper film 126 is a insulation film which is located between the inter-layer insulation films 125 and 127. The etching stopper film 126 has a role of an etching stop layer when a wiring groove for the second wiring 128 is formed. A silicon nitride film, a SiC film, a silicon carbonitride film, or the like is available for the etching stopper film 126. The wiring groove in which the second wiring 128 is embedded is formed in the etching stopper film 126, and the second wiring 128 is embedded, through the barrier metal 130, in the wiring groove. The etching stopper film 126 may be removed depending on selection of an etching condition for the wiring groove.

The inter-layer insulation film 127 is an insulation film which is formed on the etching stopper film 126. As the inter-layer insulation film 127, for example, a silicon oxide film, a SiOC film, a low permittivity film (e.g. SiOCH film) whose relative permittivity is lower than permittivity of a silicon oxide film, or the like, is available. The inter-layer insulation film 127 may be a film in which a plurality of insulation films are laminated. The inter-layer insulation film 127 may have the same material as that of the inter-insulation film 125. The inter-layer insulation film 125 includes a wiring groove in which the second wiring 128 is embedded. The second wiring 128 is embedded, through the barrier metal 130, in the wiring groove.

The second wiring 128 is wiring which is embedded, through the barrier metal 130, in a wiring groove which is formed in the inter-layer insulation film 127 and the etching stopper film 126. The second wiring 128 is integrated with the plug 129. The plug 129 is embedded, through the barrier metal 130, in the lower hole which is formed in the inter-layer insulation film 125, the protection insulation film 124, and the hard mask film 122. The plug 129 is electrically connected to the second upper electrode 121 through the barrier metal 130. For example, copper is available for the second wiring 128 and the plug 129. The diameter (or area) of the region where the plug 129 (strictly, the barrier metal 130) is in contact with the second upper electrode 121 is configured to be smaller than the diameter (or area) of the region where the first wiring 115 is in contact with the variable resistance layer 119 in order to suppress an embedding failure of plating in the lower hole.

The barrier metal 130 is a conductive film with a barrier property which coats a side face and a bottom face of the second wiring 128 and the plug 129 in order to prevent the metal (e.g. copper) forming the second wiring 128 (including the plug 129) from diffusing into the inter-insulation films 125 and 127 or a lower layer. If the second wiring 128 and the plug 129 are composed by metal element including cupper as a primary component, the barrier metal 130 can use, for example, a refractory metal and a nitride thereof such as tantalum, tantalum nitride, titanium nitride, tungsten carbonitride, or a laminated film thereof. The barrier metal 130 is preferably the same material as that of the second upper electrode 121. For example, if the barrier metal 130 has a lamination structure including tantalum nitride (lower layer)/tantalum (upper layer), it is preferable that tantalum nitride as a lower layer material is used for the second upper electrode 121.

The barrier insulation film 131 is an insulation film which is formed on the inter-layer insulation film 127 including the second wiring 128, and has a role to prevent oxidation of the metal forming the second wiring 128 (e.g. copper) and to prevent the metal forming the second wiring 128 from diffusing into the upper layer. A silicon carbonitride film, a silicon nitride film, a laminated structure thereof, or the like, is available for the barrier insulation film 131.

Embodiment 5

A manufacturing process of a semiconductor device in which the "three-terminal switch" in which the upper electrodes are electrically connected to each other is formed in a multi-layered wiring layer, in the second exemplary embodiment, in particular a step of forming the "three-terminal switch" in the multi-layered wiring layer is explained by using drawings. FIG. 10A to FIG. 10D are cross-sectional views schematically illustrating steps 1 to 12 of the manufacturing process of the semiconductor device in which the "three-terminal switch" is formed in the multi-layered wiring layer, in the second exemplary embodiment.

(Step 1)

An inter-layer insulation film 142 (e.g. silicon oxide film, 300 nm in thickness) is deposited on a semiconductor substrate 141 (e.g. substrate on which a semiconductor element is formed), after that a barrier insulation film 143 (e.g. silicon nitride film, 30 nm in thickness) is deposited on the inter-layer insulation film 142, after that an inter-layer insulation film 144 (e.g. silicon oxide film, 200 nm in thickness) is deposited on the barrier insulation film 143, after that a wiring groove is formed in the inter-layer insulation film 144 and the barrier insulation film 143 using a lithography method (including photoresist forming, dry etching, and photoresist removal), after that through a barrier metal A 146A (e.g. tantalum nitride/tantalum, 5 nm/5 nm in thickness), a first wiring A 145a and a first wiring B 145b (e.g. copper) is embedded in the wiring groove. In the step 1, the inter-layer insulation films 142 and 144 can be formed by the plasma CVD method. The plasma CVD (Chemical Vapor Deposition) method is a technique in which, for example, gas raw materials, or vaporized liquid raw materials are continuously supplied in a reaction chamber under reduced pressure, molecules are raised to an exited state by plasma energy, and a continuous film are formed on a substrate by gas phase reaction or substrate surface reaction. In the step 1, the first wiring A 145a and the first wiring B 145b can be formed, for example, by forming the barrier metal 146 (e.g. lamination film of tantalum nitride/tantalum) by the PVD method, embedding copper in the wiring groove by an electrolytic plating method after forming a copper seed by the PVD method, and removing excess copper outside the wiring groove by the CMP method after performing heat treatment at the temperature of 200° C. or more.

Such a series of methods for forming copper wiring can use a general technique in the technical field. The CMP (Chemical Mechanical Polishing) method is a method for flattening irregularities of a wafer surface which may occur during a multi-layer wiring forming process by polishing by bringing into contact with a rotating polishing pad while flowing polishing solution on the wafer surface. Embedded wiring (damascene interconnect) is formed by polishing excess copper embedded in a groove, and flattening is carried out by polishing an inter-layer insulation film.

(Step 2)

A barrier insulation film 147 (e.g. silicon carbonitride film, 30 nm in thick) is formed on the inter-layer insulation film 4 including the first wiring A 145a and the first wiring B 145b. The barrier insulation film 147 can be formed by the plasma CVD method. The thickness of the barrier insulation film 147 is preferably in the order of 10 nm to 50 nm.

(Step 3)

A hard mask film 148 (e.g. silicon oxide film) is formed on the barrier insulation film 147. In the light of keeping etching selectivity high in dry etching processing, the hard mask film 148 is preferably a different material from the barrier insulation film 147, and may be an insulation film or a conductive film. As the hard mask film 148, for example, a silicon oxide film, a silicon nitride film, TiN, Ti, tantalum, or tantalum nitride is available, and a lamination body of silicon nitride/SiO$_2$ is available.

(Step 4)

An opening is patterned on the hard mask film 148 using photoresist (not shown), an opening pattern is formed in the hard mask film 148 by carrying out dry etching using the photoresist as a mask, after that the photo resist is removed by using oxygen plasma ashing, or the like. At this time, the dry etching is not necessarily required to stop at an upper face of the barrier insulation film 147, and may reach the inside of the barrier insulation film 147.

(Step 5)

An opening is formed in the barrier insulation film 147 by etching back (dry etching) the barrier insulation film 147 which is exposed at the opening of the hard mask film 148, by using the hard mask film 148 as a mask, thereby the first wiring A 145a and the first wiring B 145b are exposed at the opening of the barrier insulation film 147. At this time, the opening may reach the inside of the inter-layer insulation film. After that copper oxide formed on an exposed face of the first wiring A 145a and the first wiring B 145b is removed by carrying out an organic separating treatment with amine-based separating solution, and an etching by-product which is generated during etching-back is also removed. In step 5, it is preferable that the hard mask film 148 is completely removed during etching-back, and may be left if the film 148 is an insulation material. A shape of the opening of the barrier insulation film 7 may be a circle, a square, or a rectangle and may be 20 nm to 500 nm in diameter of the circle or on a side of the rectangle. In the step 5, in the etching-back of the insulation barrier film 147, a wall face of the opening of the insulation barrier film 147 can be tapered by reactive dry etching. In the reactive dry etching, gas including fluorocarbon is available for etching gas.

(Step 6)

As an ion conduction layer 149b forming the variable resistance layer 149, a SIOCH-based polymer film of 6 nm including oxygen, carbon, and hydrogen is formed on the insulation barrier film 7 including the first wiring A 145a and the first wiring B 145b using the plasma CVD. Raw materials of cyclic organosiloxane and helium as a carrier gas are introduced into a reaction chamber, and application of RF power is started when supply of the two is stabilized and a pressure in the reaction chamber becomes constant. Supplied amount of the raw materials is 10 to 200 sccm, supply of helium is 500 sccm through a raw material carburetor, and 500 sccm is directly supplied into the reaction chamber using a different line.

In the step 6, since the opening of the barrier insulation film 147 includes water or the like due to the organic separating treatment, outgassing with heat treatment is preferably carried out under reduced pressure at the temperature of 250° C. to 350° C. before deposition of the variable resistance layer 149. In this case, in order not to oxidize a copper surface again, the process is required to be carried out under vacuum or at nitrogen atmosphere or the like. In the step 6, before deposition of the variable resistance layer 149, gas cleaning or plasma cleaning treatment using $H_2$ gas may be carried out with respect to the first wiring A 145$a$ and the first wiring B 145$b$ which are exposed from the opening of the barrier insulation film 147. Thereby when the variable resistance layer 149 is formed, oxidation of copper of the first wiring A 145$a$ and the first wiring B 145$b$ can be suppressed, and thermal diffusion of copper (material migration) during the process can be suppressed.

In the step 6, before deposition of the ion conduction layer 149$b$, the oxidation prevention film 149$a$ of lamination including 0.5 nm titanium film and 0.5 nm aluminum is deposited using the PVD method, oxidation of a copper wiring surface of the first wiring A 145$a$ and the first wiring B 145$b$ is suppressed. The lamination of titanium and aluminum of the oxidation prevention film 149$a$ is oxidized while the ion conduction layer 149$b$ is formed to be an oxide film. In the step 6, since the variable resistance layer 149 has to be embedded in the uneven opening with full coverage, the plasma CVD method is preferably employed.

(Step 7)

An alloy of ruthenium and titanium of 10 nm in thickness is formed on the variable resistance layer 149 as a first upper electrode 150 by using the co-sputtering method. At this time a ruthenium target and a titanium target are placed in the same chamber and an alloy film of "ruthenium and titanium" is deposited by concurrently carrying out sputtering. When power applied to the ruthenium target is 150 W and power applied to the titanium target is 50 W, content ratio of ruthenium in the alloy of "ruthenium and titanium" becomes 70 atm %. A second upper electrode 151 (e.g. tantalum film, 50 nm in thickness) is formed on the first upper electrode 90.

(Step 8)

A hard mask film 152 (e.g. silicon nitride film, 30 nm in thickness) and a hard mask film 13 (e.g. silicon oxide film, 200 nm in thickness) are laminated in this order on the second upper electrode 151. In the step 8, the hard mask film 152 and the hard mask film 153 can be formed using the plasma CVD method. The hard mask films 12 and 13 can be formed using a general plasma CVD method in this technical field. The hard mask film 152 and the hard mask 153 are preferably different kinds of films, for example, the hard mask film 152 may be a silicon nitride film, and the hard mask film 153 may be a $SiO_2$ film. In this case, the hard mask film 152 is preferably the same material as that of a protection insulation film 154 and the barrier insulation film 147 described below. It becomes possible that a surrounding of a variable resistance element is made from the same material, a boundary face is integrated, entry of water from the outside is prevented, and separation from the variable resistance element itself is prevented. The hard mask film 152 can be formed by the plasma CVD method, a reaction chamber has to be maintained under reduced pressure before coating. While being under reduced pressure, a problem occurs in which oxygen is separated from the variable resistance layer 149, and a leak current of the ion conduction layer is increased due to oxygen defect. In order to suppress the problem, it is preferable that a coating temperature is not greater than 350° C., preferably not greater than 250° C. Further, since exposure in film forming gas under reduced pressure occurs before film formation, it is preferable reductive gas is not used. For example, it is preferable that by using $SiH_4/N_2$ mixture gas as raw materials, a silicon nitride film which is formed by high density plasma is used.

(Step 9)

Photoresist (not shown) is formed in order to pattern the variable resistance element unit on the hard mask film 153, after that the hard mask film 153 is dry-etched using the photo resist as a mask until the hard mask film 152 appears, after that the photo resist is removed by using oxygen plasma ashing and organic separating.

(Step 10)

By using the hard mask film 153 as a mask, the hard mask film 152, the second upper electrode 151, the first upper electrode 150, and the variable resistance 149 are continuously dry-etched. At this time, it is preferable that the hard mask film 153 is completely removed during etch back, however the film 153 may remain. For example, in the step 11, if the second upper electrode 151 is made from tantalum, formation by RIE of $Cl_2$-based is possible, and if the first upper electrode 150 is made from the "alloy of ruthenium and titanium", RIE formation by using mixture gas of $Cl_2/O_2$ is possible. In etching of the variable resistance 149, dry etching has to be stopped on the insulation barrier film 87 of the lower face. If the variable resistance layer 149 is the SIOCH-based polymer film including oxygen, carbon, and hydrogen, and the barrier insulation film 147 is a silicon nitride film or a silicon carbonitride film, RIE formation is possible by adjusting an etching condition using a mixture gas such as $CF_4$-based, $CF_4/Cl_2$-based, $CF_4/Cl_2/Ar$-based, or the like. By using the hard mask RIE method, without exposing a variable resistance element unit to the oxygen plasma ashing for resist removal, the variable resistance layer 149 can be formed. If an oxidation treatment is carried out by oxygen plasma after the formation, it is possible to irradiate an oxidation plasma treatment without depending on resist separating time.

(Step 11)

The protection insulation film 154 (e.g. silicon nitride film, 30 nm in thickness) is deposited on the barrier insulation film 147 including the hard mask film 152, the second upper electrode 151, the first upper electrode 150, and the variable resistance layer 149. In the step 11, though the protection insulation film 154 can be formed by the plasma CVD method, since the reaction chamber is required to be under reduced pressure before coating, a problem occurs in which oxygen is separated from a side face of the variable resistance layer 149, and a leak current of the ion conduction layer is increased. In order to suppress them, a temperature at which the protection insulation film 154 is formed is preferably not greater than 250° C. Since exposure in film forming gas under reduced pressure before the deposition, reductive gas is preferably not used. For example, a silicon nitride film is preferably used, which is formed by high density plasma using $SiH_4/N_2$ mixture gas, as raw materials, at the substrate temperature of 200° C.

(Step 12)

An inter-layer insulation film 155 (e.g. SiOC film), and an inter-layer insulation film 157 (e.g. silicon oxide film) are deposited in this order on the protection insulation film 154, after that a wiring groove for a second wiring 158, and the lower hole for a plug 159 are formed, the second wiring 158 (e.g. copper) and the plug 159 (e.g. copper) are concurrently formed in the wiring groove and the lower hole through a barrier metal 160 (e.g. tantalum nitride/tantalum) using a copper dual damascene wiring process, after that a barrier insulation film 161 (e.g. silicon nitride film) is deposited on the inter-layer insulation film 157 including the second wiring 158. In the step 12, formation of the second wiring 158 can use the same process as that of lower layer wiring formation. At this time, when the barrier metal 160 and the second upper electrode 151 are made from the same material, contact resistance between the plug 159 and the second upper electrode 151 can be reduced, and element performance can be improved (resistance of three-terminal switch at ON is reduced). In the step 12, the inter-layer insulation film 155 and the inter-layer insulation film 156 can be formed by the plasma CVD method. In the step 12, in order to eliminate a difference in level formed by the "three-terminal switch" 162, the inter-layer insulation film 155 may be thickly formed, the inter-layer insulation film 155 may be shaved and flattened by CMP, and the inter-layer insulation film 155 may have a desired thickness.

By referring to exemplary embodiments (and examples), the invention of the present application is explained above. The invention of the present application is not limited to the above mentioned embodiments (and examples). It is to be understood that to the configurations and details of the invention of the present application, various changes can be made within the scope of the invention of the present application.

This application claims priority from Japanese Patent Application No. 2012-141049 filed on Jun. 22, 2012, and the contents of which are incorporation herein by reference in their entirety.

INDUSTRIAL APPLICABILITY

The variable resistance element according to the invention can be used as a non-volatile switching element, in particular the invention can be preferably used as the non-volatile switching element which composes an electronic device like a programmable-logic, memory, or the like.

The invention claimed is:

1. A variable resistance element, comprising:
   a first electrode;
   a second electrode; and
   a variable resistance film located between the electrodes,
   wherein the first electrode includes copper, the second electrode is an electrode that is made from an alloy including ruthenium, and the alloy including ruthenium is an alloy of ruthenium and titanium,
   wherein ruthenium content rate in the alloy is 70 atm % and a titanium content rate in the alloy is 30 atm %, and
   wherein the variable resistance film is an ion conduction layer.

2. The variable resistance element according to claim 1, wherein the ion conduction layer conducts a metal ion.

3. The variable resistance element according to claim 1, wherein the ion conduction layer is a polymer layer including at least silicon, oxygen, and carbon as primary components, and
   relative permittivity of the polymer including at least silicon, oxygen, and carbon as primary components is not less than 2.1 and not more than 3.0.

* * * * *